United States Patent
Viscusi et al.

(10) Patent No.: US 12,118,268 B2
(45) Date of Patent: Oct. 15, 2024

(54) PLAYBACK DEVICE WITH CONFORMING CAPACITIVE TOUCH SENSOR ASSEMBLY

(71) Applicant: Sonos, Inc., Santa Barbara, CA (US)

(72) Inventors: Mark S. Viscusi, Wrentham, MA (US); Randel W. Roberts, Jr., Melrose, MA (US)

(73) Assignee: Sonos, Inc., Goleta, CA (US)

( * ) Notice: Subject to any disclaimer, the term of this patent is extended or adjusted under 35 U.S.C. 154(b) by 245 days.

(21) Appl. No.: 17/731,601

(22) Filed: Apr. 28, 2022

(65) Prior Publication Data

US 2022/0382508 A1 Dec. 1, 2022

Related U.S. Application Data

(60) Provisional application No. 63/195,397, filed on Jun. 1, 2021.

(51) Int. Cl.
*H04R 1/10* (2006.01)
*G04G 9/00* (2006.01)
(Continued)

(52) U.S. Cl.
CPC ............. *G06F 3/165* (2013.01); *G04G 9/007* (2013.01); *G04G 21/08* (2013.01); *G06F 3/0416* (2013.01);
(Continued)

(58) Field of Classification Search
CPC .......... H03K 2017/9602; H03K 2217/960755; H03K 17/962; H04R 1/1041
See application file for complete search history.

(56) References Cited

U.S. PATENT DOCUMENTS

| 5,440,644 A | 8/1995 | Farinelli et al. |
| 5,761,320 A | 6/1998 | Farinelli et al. |
| (Continued) | | |

FOREIGN PATENT DOCUMENTS

| EP | 1389853 A1 | 2/2004 |
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.
(Continued)

*Primary Examiner* — Ping Lee
(74) *Attorney, Agent, or Firm* — Finch & Maloney PLLC

(57) ABSTRACT

Aspects of the present disclosure relate to playback devices having a non-flat surface and comprising a flexible electronic assembly conforming to that surface. The flexible electronic assembly may include (i) a flexible substrate having a first portion and a second portion, (ii) an array of capacitive touch sensor electrodes arranged on the first portion, and (iii) a plurality of conductors that are electrically coupled to the array of capacitive touch sensor electrodes and that extend onto the second portion. The first portion may include a plurality of cutouts. Each cutout of a first subset of the plurality of cutouts may be positioned between a respective set of two or more electrodes in the array of capacitive touch sensor electrodes. Each cutout of a second subset of the plurality of cutouts may be configured to reduce a wrinkling of the first portion when conforming the first portion to the non-flat surface.

20 Claims, 10 Drawing Sheets

(51) Int. Cl.
*G04G 21/08* (2010.01)
*G06F 3/041* (2006.01)
*G06F 3/044* (2006.01)
*G06F 3/16* (2006.01)

(52) U.S. Cl.
CPC ......... *G06F 3/0446* (2019.05); *H04R 1/1008* (2013.01); *H04R 1/1041* (2013.01); *H04R 1/105* (2013.01); *G06F 2203/04102* (2013.01); *H04R 2420/07* (2013.01)

(56) References Cited

U.S. PATENT DOCUMENTS

| | | | |
|---|---|---|---|
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington |
| 8,483,853 | B1 | 7/2013 | Lambourne |
| 8,942,252 | B2 | 1/2015 | Balassanian et al. |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2006/0232559 | A1* | 10/2006 | Chien ............... G06F 3/0445 345/168 |
| 2007/0142944 | A1 | 6/2007 | Goldberg et al. |
| 2016/0253040 | A1* | 9/2016 | Lee ............... H03K 17/962 345/174 |
| 2022/0004272 | A1* | 1/2022 | Parker ............... H03K 17/962 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
*Sonos, Inc.* v. *D&M Holdings* (No. 14-1330-RGA), DI 219, Claim Construction Opinion (Jan. 12, 2017) (24 pages).
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

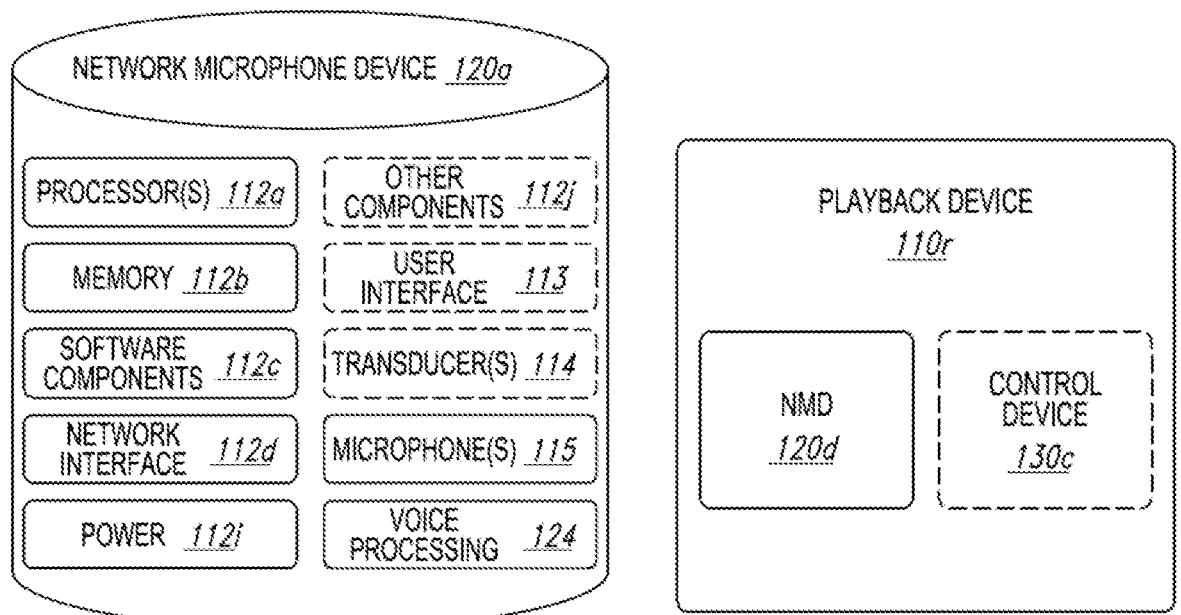
Figure 1F
Figure 1G
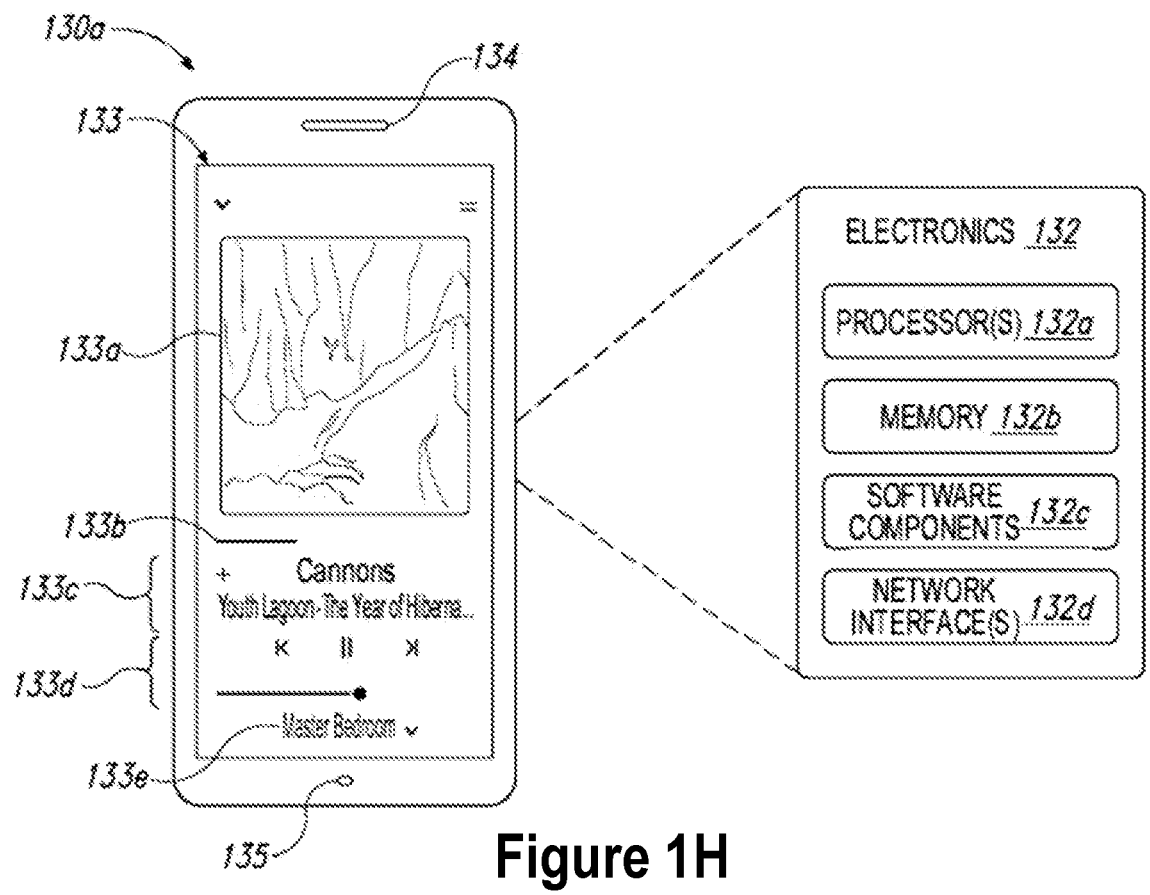
Figure 1H

PLAYBACK DEVICE WITH CONFORMING CAPACITIVE TOUCH SENSOR ASSEMBLY

CROSS REFERENCE TO RELATED APPLICATIONS

This application claims priority to U.S. Provisional Patent Application No. 63/195,397, filed on Jun. 1, 2021, titled "Conforming Capacitive Touch Sensor Assembly for Playback Devices," which is hereby incorporated herein by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

Given the ever-growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of an example network microphone device.

FIG. 1G is a block diagram of an example playback device.

FIG. 1H is a partially schematic diagram of an example control device.

Figure 1A:
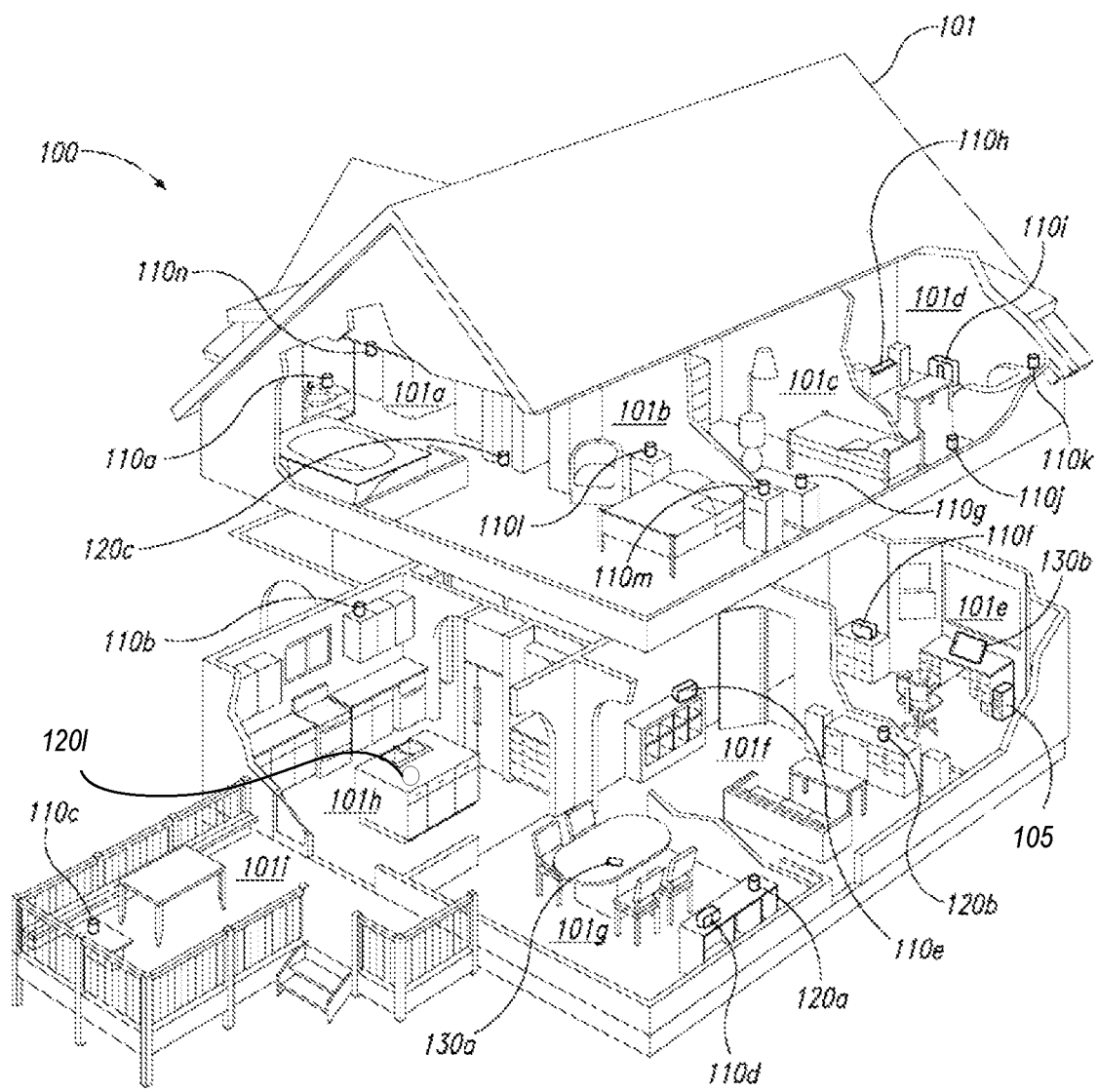
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Electronic devices typically include a touch-sensitive input surface to facilitate user control of the electronic device. For instance, a laptop computer may comprise a touch pad to control a position of a mouse cursor on a screen of the laptop. Conventionally, these touch-sensitive input surfaces are created through the integration of an array of capacitive touch sensor electrodes into a flat, rigid substrate (e.g., a rigid printed circuit board (PCB)) that is positioned against a flat surface of the device.

While such a conventional approach to creating a touch-sensitive surface works when the touch-sensitive surface is flat, problems may arise with such an arrangement when the surface is a non-flat (e.g., curved) surface. Such non-flat surfaces are common on devices with a smaller form factor such as wearable devices (e.g., headphone devices). For instance, the electrodes may not be a constant distance from an exterior of the non-flat surface when a flat, rigid substrate carrying the electrodes is positioned proximate the interior face of the non-flat surface. The varied distances between the electrodes and the exterior face of the non-flat surface may undesirably result in a wide variance in touch sensitivity across the surface.

One approach to make the distance between the electrodes and an exterior face of the touch surface more consistent is to integrate the electrodes into a flexible substrate (e.g., a flexible circuit board) that can conform to an interior face of the non-flat surface. However, attempting to conform a flexible circuit board to a non-flat surface may cause wrinkling and/or bubbling in the flexible circuit board. Such wrinkling and bubbling may adversely affect the functionality of the capacitive touch sensor electrodes. For instance, electrodes positioned in (or proximate) areas of the flexible circuit board that have wrinkles or bubbles may undesirably have a different touch sensitivity than electrodes in other areas of the flexible circuit board.

Accordingly, aspects of the present disclosure describe a capacitive touch sensor assembly that is integrated into a flexible substrate with cutouts having particular shapes and arranged in a particular pattern that reduces or prevents a wrinkling of the circuit board when conforming the flexible substrate to a non-flat surface. Additionally, the shape and placement of the cutouts is designed to have a reduced impact on the functionality of the capacitive touch sensor electrodes by reducing the overlap of the cutouts with the electrodes.

In some embodiments, for example, a flexible electronic assembly is provided including a flexible substrate (e.g., a flat flexible substrate) having a first portion and a second portion, where the second portion extends (e.g., laterally) from the first portion, an array of capacitive touch sensor electrodes arranged on the first portion of the flexible substrate, and a plurality of conductors that are electrically coupled to the array of capacitive touch sensor electrodes and that extend onto the second portion of the flexible substrate. The first portion of the flexible substrate includes a plurality of cutouts. Each cutout of a first subset of the plurality of cutouts is positioned between a respective set of two or more electrodes in the array of capacitive touch sensor electrodes. Each cutout of a second subset of the plurality of cutouts is configured to reduce a wrinkling of the first portion of the flexible substrate when conforming the first portion of the flexible substrate to a non-flat surface.

In another aspect, a playback device is provided including a housing portion comprising a non-flat surface and a flexible touch-sensitive electronic assembly. The flexible touch-sensitive electronic assembly includes a flexible substrate having a first portion and a second portion, where the second portion extends from the first portion, and the first portion is at least partially disposed on the non-flat surface of the housing portion. The flexible touch-sensitive electronic assembly further includes an array of capacitive touch sensor electrodes arranged on the first portion of the flexible substrate, and a plurality of conductors that are electrically coupled to the array of capacitive touch sensor electrodes and that extend onto the second portion of the flexible substrate. The first portion of the flexible substrate includes a plurality of cutouts. Each cutout of a subset of the plurality of cutouts is positioned between a respective set of two or more electrodes in the array of capacitive touch sensor electrodes. The playback device further includes one or more audio drivers, at least one processor, at least one communication interface, at least one non-transitory computer-readable medium, and program instructions stored on the at least one non-transitory computer-readable medium that are executable by the at least one processor such that the playback device is configured to (i) receive, via the at least one communication interface, media content, (ii) cause the one or more audio drivers to play back the media content, (iii) detect, using the flexible touch-sensitive electronic assembly, a touch input, and (iv) after detection of the touch input, modify playback of the media content based on the touch input Another issue that may arise when conforming a flexible circuit board to a non-flat housing surface is doing so reliably and repeatedly with a high degree of accuracy. One way to do so is to arrange both the circuit board and the housing in respective jigs so they are positioned at a predetermined orientation. Then, the two pieces can be joined together using a predetermined and repeatable motion. However, there may be circumstances where one of the two pieces may not be placed into a jig in this manner. For instance, the housing may not have any physical landmarks for aligning the housing in a jig. An example of this type of housing surface may involve an earpiece of a headphone device. Earpieces may be circular and symmetric in shape, and surfaces that are designed to be touch-sensitive may be entirely smooth. Such smooth, symmetric surfaces may be difficult to consistently place in a jig in the same position.

In order to help address these issues, the present disclosure describes a method for consistently conforming a flat flexible circuit board to a smooth, symmetric, non-flat housing surface. In particular, the method involves using an optical sensor to locate a physical center of the housing surface. Based on this physical center, the optical sensor may determine the housing surface's position in physical space. Additionally, the optical sensor may take advantage of visual markings on the housing surface to rotate the housing surface to a desired angle of rotation. For instance, the housing surface may include textual markings, such as a brand name of the playback device or some other visual marking that can be used as a fiducial marker. Based on an orientation of the text or other fiducial marker, the optical sensor may determine an angle of rotation of the housing surface. Using the determined angle of rotation and the determined position of the housing surface, the housing surface can then be rotated to the desired angle of rotation and joined together with the flexible circuit board, which may be arranged in a jig at a predetermined orientation.

Accordingly, in yet another aspect, a method includes (i) inserting a flexible electronic assembly into a jig to arrange the flexible electronic assembly in a predetermined orientation, where the flexible electronic assembly includes a flexible substrate and an array of capacitive touch sensor electrodes arranged on the flexible substrate, (ii) determining, using an optical sensor, a position and an angle of rotation of a housing portion of a playback device, the housing portion comprising a non-flat surface, and (iii) based on (a) the predetermined orientation of the flexible electronic assembly and (b) the determined position and angle of rotation of the housing portion, aligning the housing portion with the flexible electronic assembly and causing the flexible electronic assembly to conform to the non-flat surface of the housing portion. The flexible substrate of the flexible electronic assembly includes a plurality of cutouts, each respective cutout of the plurality of cutouts being positioned between respective electrodes in the array of capacitive touch sensor electrodes, and the presence of the plurality of cutouts reduces a wrinkling of the flexible substrate when conforming the flexible substrate to the non-flat surface of the housing portion.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

II. Suitable Operating Environment a. Suitable Media Playback System

Figure 1B:
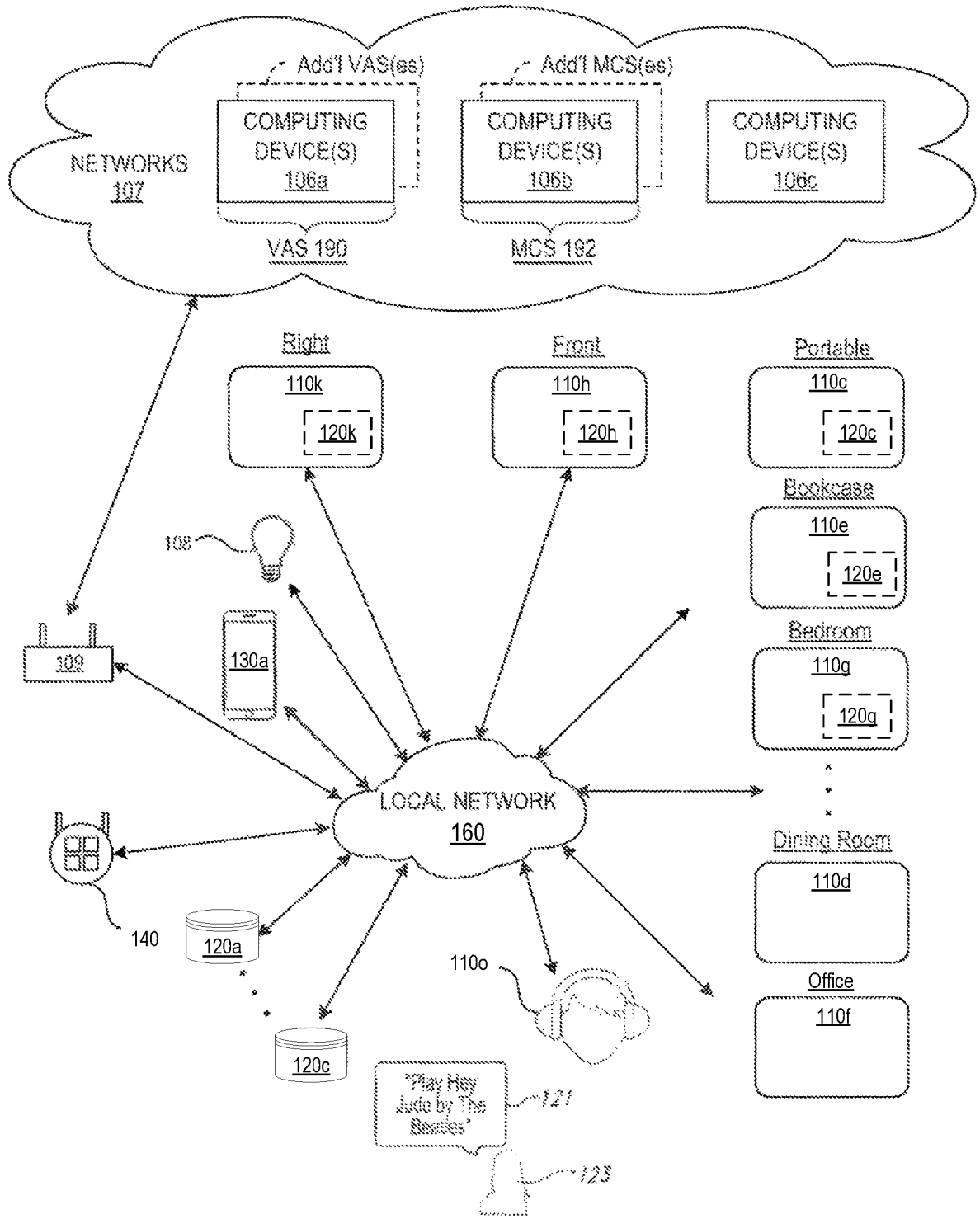
FIG. 1B is a schematic diagram of the media playback system of FIG. 1A and one or more networks.

FIGS. 1A and 1B illustrate an example configuration of a media playback system ("MPS") 100 in which one or more embodiments disclosed herein may be implemented. Referring first to FIG. 1A, a partial cutaway view of MPS 100 distributed in an environment 101 (e.g., a house) is shown. The MPS 100 as shown is associated with an example home environment having a plurality of rooms and spaces. The MPS 100 comprises one or more playback devices 110 (identified individually as playback devices 110a-o), one or more network microphone devices ("NMDs") 120 (identified individually as NMDs 120*a-c*), and one or more control devices 130 (identified individually as control devices 130*a* and 130*b*).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the MPS 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the MPS 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the MPS 100 is configured to play back audio from a first playback device (e.g., the playback device 110*a*) in synchrony with a second playback device (e.g., the playback device 110*b*). Interactions between the playback devices 110, NMDs 120, and/or control devices 130 of the MPS 100 configured in accordance with the various embodiments of the disclosure are described in greater detail below with respect to FIGS. 1B-1H.

In the illustrated embodiment of FIG. 1A, the environment 101 comprises a household having several rooms, spaces, and/or playback zones, including (clockwise from upper left) a master bathroom 101*a*, a master bedroom 101*b*, a second bedroom 101*c*, a family room or den 101*d*, an office 101*e*, a living room 101*f*, a dining room 101*g*, a kitchen 101*h*, and an outdoor patio 101*i*. While certain embodiments and examples are described below in the context of a home environment, the technologies described herein may be implemented in other types of environments. In some embodiments, for example, the MPS 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The MPS 100 can comprise one or more playback zones, some of which may correspond to the rooms in the environment 101. The MPS 100 can be established with one or more playback zones, after which additional zones may be added, or removed to form, for example, the configuration shown in FIG. 1A. Each zone may be given a name according to a different room or space such as the office 101*e*, master bathroom 101*a*, master bedroom 101*b*, the second bedroom 101*c*, kitchen 101*h*, dining room 101*g*, living room 101*f*, and/or the outdoor patio 101*i*. In some aspects, a single playback zone may include multiple rooms or spaces. In certain aspects, a single room or space may include multiple playback zones.

In the illustrated embodiment of FIG. 1A, the master bathroom 101*a*, the second bedroom 101*c*, the office 101*e*, the living room 101*f*, the dining room 101*g*, the kitchen 101*h*, and the outdoor patio 101*i* each include one playback device 110, and the master bedroom 101*b* and the den 101*d* include a plurality of playback devices 110. In the master bedroom 101*b*, the playback devices 110*l* and 110*m* may be configured, for example, to play back audio content in synchrony as individual ones of playback devices 110, as a bonded playback zone, as a consolidated playback device, and/or any combination thereof. Similarly, in the den 101*d*, the playback devices 110*h-j* can be configured, for instance, to play back audio content in synchrony as individual ones of playback devices 110, as one or more bonded playback devices, and/or as one or more consolidated playback devices.

Referring to FIG. 1B, the home environment may include additional and/or other computing devices, including local network devices, such as one or more smart illumination devices 108 (FIG. 1B), a smart thermostat 140, and a local computing device 105 (FIG. 1A). In embodiments described below, one or more of the various playback devices 110 may be configured as portable playback devices, while others may be configured as stationary playback devices. For example, the headphones 110*o* (FIG. 1B) are a portable playback device, while the playback device 110*e* on the bookcase may be a stationary device. As another example, the playback device 110*c* on the Patio may be a battery-powered device, which may allow it to be transported to various areas within the environment 101, and outside of the environment 101, when it is not plugged in to a wall outlet or the like.

With reference still to FIG. 1B, the various playback, network microphone, and controller devices and/or other network devices of the MPS 100 may be coupled to one another via point-to-point connections and/or over other connections, which may be wired and/or wireless, via a local network 160 that may include a network router 109. For example, the playback device 110*j* in the Den 101*d* (FIG. 1A), which may be designated as the "Left" device, may have a point-to-point connection with the playback device 110*k*, which is also in the Den 101*d* and may be designated as the "Right" device. In a related embodiment, the Left playback device 110*j* may communicate with other network devices, such as the playback device 110*h*, which may be designated as the "Front" device, via a point-to-point connection and/or other connections via the local network 160.

The local network 160 may be, for example, a network that interconnects one or more devices within a limited area (e.g., a residence, an office building, a car, an individual's workspace, etc.). The local network 160 may include, for example, one or more local area networks (LANs) such as a wireless local area network (WLAN) (e.g., a WiFi network, a Z-Wave network, etc.) and/or one or more personal area networks (PANs) (e.g. a BLUETOOTH network, a wireless USB network, a ZigBee network, an IRDA network, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.12, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, 6 GHz, and/or another suitable frequency.

The MPS 100 is configured to receive media content from the local network 160. The received media content can comprise, for example, a Uniform Resource Identifier (URI) and/or a Uniform Resource Locator (URL). For instance, in some examples, the MPS 100 can stream, download, or otherwise obtain data from a URI or a URL corresponding to the received media content.

As further shown in FIG. 1B, the MPS 100 may be coupled to one or more remote computing devices 106 via a wide area network ("WAN") 107. In some embodiments, each remote computing device 106 may take the form of one or more cloud servers. The remote computing devices 106 may be configured to interact with computing devices in the environment 101 in various ways. For example, the remote computing devices 106 may be configured to facilitate streaming and/or controlling playback of media content, such as audio, in the environment 101 (FIG. 1A).

In some implementations, the various playback devices 110, NMDs 120, and/or control devices 130 may be communicatively coupled to at least one remote computing device associated with a voice assistant service ("VAS") and/or at least one remote computing device associated with a media content service ("MCS"). For instance, in the illustrated example of FIG. 1B, remote computing devices 106a are associated with a VAS 190 and remote computing devices 106b are associated with an MCS 192. Although only a single VAS 190 and a single MCS 192 are shown in the example of FIG. 1B for purposes of clarity, the MPS 100 may be coupled to multiple, different VASes and/or MCSes. In some embodiments, the various playback devices 110, NMDs 120, and/or control devices 130 may transmit data associated with a received voice input to a VAS configured to (i) process the received voice input data and (ii) transmit a corresponding command to the MPS 100. In some aspects, for example, the computing devices 106a may comprise one or more modules and/or servers of a VAS. In some implementations, VASes may be operated by one or more of SONOS®, AMAZON®, GOOGLE® APPLE®, MICROSOFT®, NUANCE®, or other voice assistant providers. In some implementations, MCSes may be operated by one or more of SPOTIFY, PANDORA, AMAZON MUSIC, GOOGLE PLAY, or other media content services.

In some embodiments, the local network 160 comprises a dedicated communication network that the MPS 100 uses to transmit messages between individual devices and/or to transmit media content to and from MCSes. In certain embodiments, the local network 160 is configured to be accessible only to devices in the MPS 100, thereby reducing interference and competition with other household devices. In other embodiments, however, the local network 160 comprises an existing household communication network (e.g., a household WiFi network). In some embodiments, the MPS 100 is implemented without the local network 160, and the various devices comprising the MPS 100 can communicate with each other, for example, via one or more direct connections, PANs, telecommunication networks (e,g., an LTE network or a 5G network, etc.), and/or other suitable communication links.

In some embodiments, audio content sources may be regularly added or removed from the MPS 100. In some embodiments, for example, the MPS 100 performs an indexing of media items when one or more media content sources are updated, added to, and/or removed from the MPS 100. The MPS 100 can scan identifiable media items in some or all folders and/or directories accessible to the various playback devices and generate or update a media content database comprising metadata (e.g., title, artist, album, track length) and other associated information (e.g., URIs, URLs) for each identifiable media item found. In some embodiments, for example, the media content database is stored on one or more of the various playback devices, network microphone devices, and/or control devices of MPS 100.

As further shown in FIG. 1B, the remote computing devices 106 further include remote computing device 106c configured to perform certain operations, such as remotely facilitating media playback functions, managing device and system status information, directing communications between the devices of the MPS 100 and one or multiple VASes and/or MCSes, among other operations. In one example, the remote computing devices 106c provide cloud servers for one or more SONOS Wireless HiFi Systems.

In various implementations, one or more of the playback devices 110 may take the form of or include an on-board (e.g., integrated) network microphone device configured to receive voice utterances from a user. For example, the playback devices 110c-110h, and 110k include or are otherwise equipped with corresponding NMDs 120c-120h, and 120k, respectively. A playback device that includes or is equipped with an NMD may be referred to herein interchangeably as a playback device or an NMD unless indicated otherwise in the description. In some cases, one or more of the NMDs 120 may be a stand-alone device. For example, the NMD 120l may be a stand-alone device. A stand-alone NMD may omit components and/or functionality that is typically included in a playback device, such as a speaker or related electronics. For instance, in such cases, a stand-alone NMD may not produce audio output or may produce limited audio output (e.g., relatively low-quality audio output).

The various playback and network microphone devices 110 and 120 of the MPS 100 may each be associated with a unique name, which may be assigned to the respective devices by a user, such as during setup of one or more of these devices. For instance, as shown in the illustrated example of FIG. 1B, a user may assign the name "Bookcase" to playback device 110e because it is physically situated on a bookcase. Similarly, the NMD 120l may be assigned the named "Island" because it is physically situated on an island countertop in the Kitchen 101h (FIG. 1A). Some playback devices may be assigned names according to a zone or room, such as the playback devices 110g, 110d, and 110f, which are named "Bedroom," "Dining Room," and "Office," respectively. Further, certain playback devices may have functionally descriptive names. For example, the playback devices 110k and 110h are assigned the names "Right" and "Front," respectively, because these two devices are configured to provide specific audio channels during media playback in the zone of the Den 101d (FIG. 1A). The playback device 110c in the Patio may be named "Portable" because it is battery-powered and/or readily transportable to different areas of the environment 101. Other naming conventions are possible.

As discussed above, an NMD may detect and process sound from its environment, such as sound that includes background noise mixed with speech spoken by a person in the NMD's vicinity. For example, as sounds are detected by the NMD in the environment, the NMD may process the detected sound to determine if the sound includes speech that contains voice input intended for the NMD and ultimately a particular VAS. For example, the NMD may identify whether speech includes a wake word associated with a particular VAS.

In the illustrated example of FIG. 1B, the NMDs 120 are configured to interact with the VAS 190 over the local network 160 and/or the router 109. Interactions with the VAS 190 may be initiated, for example, when an NMD identifies in the detected sound a potential wake word. The identification causes a wake-word event, which in turn causes the NMD to begin transmitting detected-sound data to the VAS 190. In some implementations, the various local network devices 105, 110, 120, and 130 (FIG. 1A) and/or remote computing devices 106c of the MPS 100 may exchange various feedback, information, instructions, and/or related data with the remote computing devices associated with the selected VAS. Such exchanges may be related to or independent of transmitted messages containing voice inputs. In some embodiments, the remote computing device(s) and the MPS 100 may exchange data via communication paths as described herein and/or using a metadata exchange channel as described in U.S. Patent Publication No. 2017-0242653 published Aug. 24, 2017, and titled "Voice Control of a Media Playback System," which is herein incorporated by reference in its entirety.

Upon receiving the stream of sound data, the VAS 190 may determine if there is voice input in the streamed data from the NMD, and if so the VAS 190 may also determine an underlying intent in the voice input. The VAS 190 may next transmit a response back to the MPS 100, which can include transmitting the response directly to the NMD that caused the wake-word event. The response is typically based on the intent that the VAS 190 determined was present in the voice input. As an example, in response to the VAS 190 receiving a voice input with an utterance to "Play Hey Jude by The Beatles," the VAS 190 may determine that the underlying intent of the voice input is to initiate playback and further determine that intent of the voice input is to play the particular song "Hey Jude." After these determinations, the VAS 190 may transmit a command to a particular MCS 192 to retrieve content (i.e., the song "Hey Jude"), and that MCS 192, in turn, provides (e.g., streams) this content directly to the NIPS 100 or indirectly via the VAS 190. In some implementations, the VAS 190 may transmit to the NIPS 100 a command that causes the MPS 100 itself to retrieve the content from the MCS 192.

In certain implementations, NMDs may facilitate arbitration amongst one another when voice input is identified in speech detected by two or more NMDs located within proximity of one another. For example, the NMD-equipped playback device 110e in the environment 101 (FIG. 1A) is in relatively close proximity to the NMD-equipped Living Room playback device 120b, and both devices 110e and 120b may at least sometimes detect the same sound. In such cases, this may require arbitration as to which device is ultimately responsible for providing detected-sound data to the remote VAS. Examples of arbitrating between NMDs may be found, for example, in previously referenced U.S. Patent Publication No. 2017-0242653.

In certain implementations, an NMD may be assigned to, or otherwise associated with, a designated or default playback device that may not include an NMD. For example, the Island NMD 1201 in the Kitchen 101h (FIG. 1A) may be assigned to the Dining Room playback device 110d, which is in relatively close proximity to the Island NMD 1201. In practice, an NMD may direct an assigned playback device to play audio in response to a remote VAS receiving a voice input from the NMD to play the audio, which the NMD might have sent to the VAS in response to a user speaking a command to play a certain song, album, playlist, etc. Additional details regarding assigning NMDs and playback devices as designated or default devices may be found, for example, in previously referenced U.S. Patent Publication No. 2017-0242653.

Further aspects relating to the different components of the example MPS 100 and how the different components may interact to provide a user with a media experience may be found in the following sections. While discussions herein may generally refer to the example MPS 100, technologies described herein are not limited to applications within, among other things, the home environment described above. For instance, the technologies described herein may be useful in other home environment configurations comprising more or fewer of any of the playback devices 110, network microphone devices 120, and/or control devices 130. For example, the technologies herein may be utilized within an environment having a single playback device 110 and/or a single NMD 120. In some examples of such cases, the local network 160 (FIG. 1B) may be eliminated and the single playback device 110 and/or the single NMD 120 may communicate directly with the remote computing devices 106a-c. In some embodiments, a telecommunication network (e.g., an LTE network, a 5G network, etc.) may communicate with the various playback devices 110, network microphone devices 120, and/or control devices 130 independent of the local network 160.

b. Suitable Playback Devices

Figure 1C:
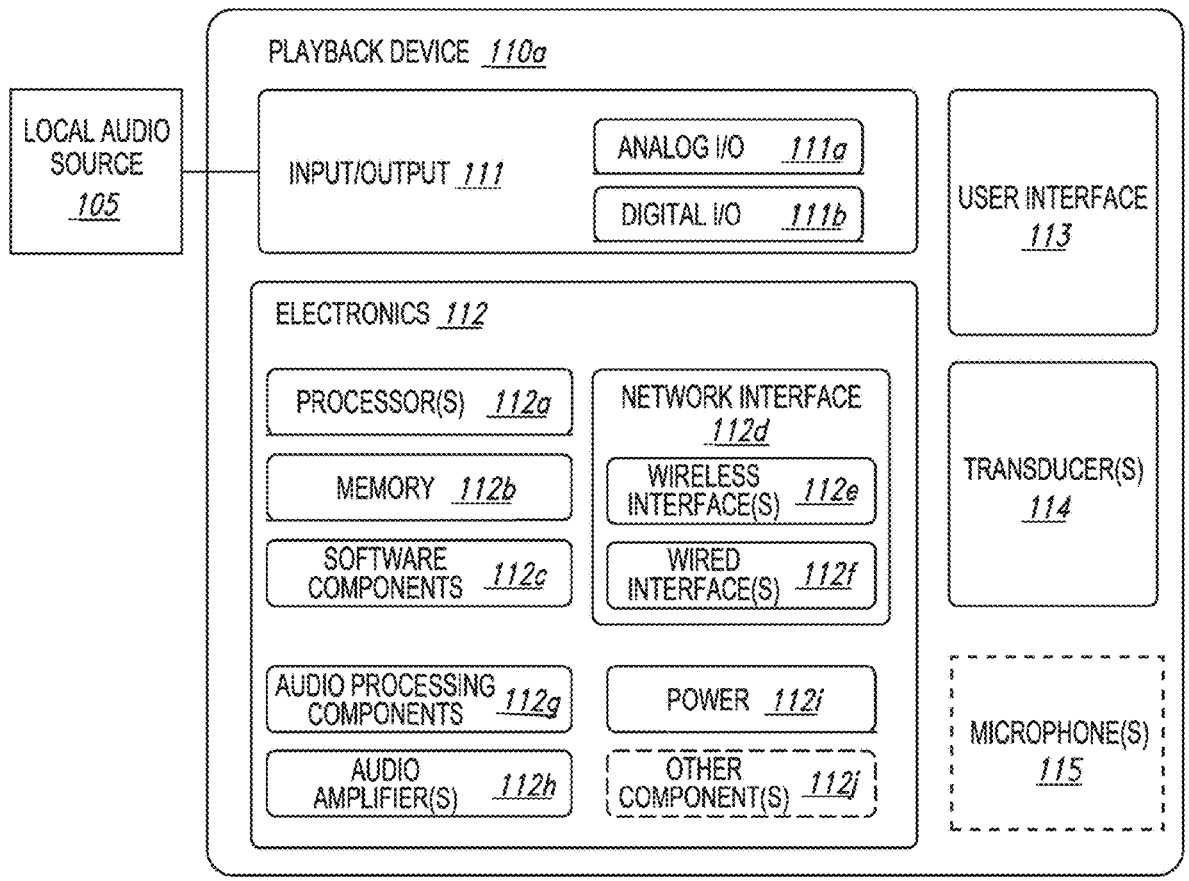
FIG. 1C is a block diagram of an example playback device.

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises a High-Definition Multimedia Interface (HDMI) interface and/or cable. In some embodiments, the digital I/O 111b includes one or more wireless communication links comprising, for example, a radio frequency (RF), infrared, WiFi, BLUETOOTH, or another suitable communication protocol. In certain embodiments, the analog I/O 111a and the digital I/O 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 150 via the input/output 111 (e.g., a cable, a wire, a PAN, a BLUETOOTH connection, an ad hoc wired or wireless communication network, and/or another suitable communication link). The local audio source 150 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 150 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 150. In other embodiments, however, the media playback system omits the local audio source 150 altogether. In some embodiments, the playback device 110a does not include an input/output 111 and receives all audio content via the local network 160.

The playback device 110a further comprises electronics 112, a user interface 113 (e.g., one or more buttons, knobs, dials, touch-sensitive surfaces, displays, touchscreens), and one or more transducers 114 (e.g., a driver), referred to hereinafter as "the transducers 114." The electronics 112 are configured to receive audio from an audio source (e.g., the local audio source 150) via the input/output 111, one or more of the computing devices 106a-c via the local network 160 (FIG. 1B) amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power components 112i (e.g., one or more power supplies, power cables, power receptacles, batteries, induction coils, Power-over Ethernet (POE) interfaces, and/or other suitable sources of electric power).

In some embodiments, the electronics 112 optionally include one or more other components 112j (e.g., one or more sensors, video displays, touchscreens, battery charging bases). In some embodiments, the playback device 110a and electronics 112 may further include one or more voice processing components that are operable coupled to one or more microphones, and other components as described below with reference to FIGS. 1F and 1G.

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the MPS 100. In some aspects, for example, the state data is shared during predetermined intervals of time (e.g., every 5 seconds, every 10 seconds, every 60 seconds) among at least a portion of the devices of the MPS 100, so that one or more of the devices have the most recent data associated with the MPS 100.

The network interface 112d is configured to facilitate a transmission of data between the playback device 110a and one or more other devices on a data network. The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the local network 160 (FIG. 1B) in accordance with a suitable wireless communication protocol (e.g., WiFi, BLUETOOTH, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

In some implementations, the power components 112i of the playback device 110a may additionally include an internal power source (e.g., one or more batteries) configured to power the playback device 110a without a physical connection to an external power source. When equipped with the internal power source, the playback device 110a may operate independent of an external power source. In some such implementations, an external power source interface may be configured to facilitate charging the internal power source. As discussed before, a playback device comprising an internal power source may be referred to herein as a "portable playback device." On the other hand, a playback device that operates using an external power source may be referred to herein as a "stationary playback device," although such a device may in fact be moved around a home or other environment.

The user interface 113 may facilitate user interactions independent of or in conjunction with user interactions facilitated by one or more of the control devices 130 (FIG. 1A). In various embodiments, the user interface 113 includes one or more physical buttons and/or supports graphical interfaces provided on touch sensitive screen(s) and/or surface(s), among other possibilities, for a user to directly provide input. The user interface 113 may further include one or more of lights (e.g., LEDs) and the speakers to provide visual and/or audio feedback to a user.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

In some embodiments, the playback device 110a may include a speaker interface for connecting the playback device to external speakers. In other embodiments, the playback device 110a may include an audio interface for connecting the playback device to an external audio amplifier or audio-visual receiver.

Figure 1D:
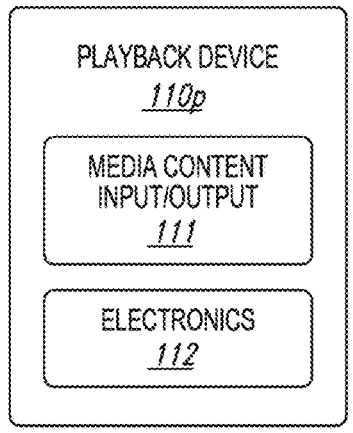
FIG. 1D is a block diagram of an example playback device.

By way of illustration, SONOS, Inc. presently offers (or has offered) for sale certain playback devices including, for example, a "SONOS ONE," "PLAY:1," "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
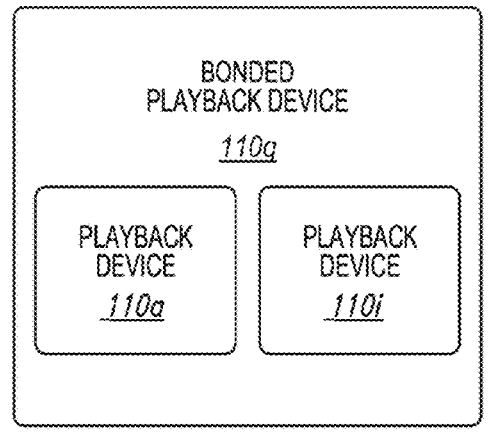
FIG. 1E is a block diagram of an example playback device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with playback device 110i, is configured to render only the mid-range and high frequency components of a particular audio content, while the playback device 110i renders the low frequency component of the particular audio content. In some embodiments, the bonded playback device 110q includes additional playback devices and/or another bonded playback device.

c. Suitable Network Microphone Devices (NMD)s

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the transducers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing components 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing components 124 (FIG. 1F). The microphones 115 are configured to detect sound (i.e., acoustic waves) in the environment of the playback device 110r, which is then provided to voice processing components 124. More specifically, each microphone 115 is configured to detect sound and convert the sound into a digital or analog signal representative of the detected sound, which can then cause the voice processing component to perform various functions based on the detected sound, as described in greater detail below. In some implementations, the microphones 115 may be arranged as an array of microphones (e.g., an array of six microphones). In some implementations the playback device 110r may include fewer than six microphones or more than six microphones. The playback device 110r optionally includes an integrated control device 130c. The control device 130c can comprise, for example, a user interface configured to receive user input (e.g., touch input, voice input) without a separate control device. In other embodiments, however, the playback device 110r receives commands from another control device (e.g., the control device 130a of FIG. 1B).

In operation, the voice-processing components 124 are generally configured to detect and process sound received via the microphones 115, identify potential voice input in the detected sound, and extract detected-sound data to enable a VAS, such as the VAS 190 (FIG. 1B), to process voice input identified in the detected-sound data. The voice processing components 124 may include one or more analog-to-digital converters, an acoustic echo canceller ("AEC"), a spatial processor (e.g., one or more multi-channel Wiener filters, one or more other filters, and/or one or more beam former components), one or more buffers (e.g., one or more circular buffers), one or more wake-word engines, one or more voice extractors, and/or one or more speech processing components (e.g., components configured to recognize a voice of a particular user or a particular set of users associated with a household), among other example voice processing components. In example implementations, the voice processing components 124 may include or otherwise take the form of one or more DSPs or one or more modules of a DSP. In this respect, certain voice processing components 124 may be configured with particular parameters (e.g., gain and/or spectral parameters) that may be modified or otherwise tuned to achieve particular functions. In some implementations, one or more of the voice processing components 124 may be a subcomponent of the processor 112a.

In some implementations, the voice-processing components 124 may detect and store a user's voice profile, which may be associated with a user account of the MPS 100. For example, voice profiles may be stored as and/or compared to variables stored in a set of command information or data table. The voice profile may include aspects of the tone of frequency of a user's voice and/or other unique aspects of the user's voice, such as those described in previously-referenced U.S. Patent Publication No. 2017-0242653.

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing components 124 receive and analyze the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing components 124 monitor the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Controller Devices

FIG. 1H is a partially schematic diagram of one of the control device 130a (FIGS. 1A and 1B). As used herein, the term "control device" can be used interchangeably with "controller," "control device," or "control system." Among other features, the control device 130a is configured to receive user input related to the MPS 100 and, in response, cause one or more devices in the MPS 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the MPS 100. In other embodiments, as described above with respect to FIG. 1G, the control device 130a is integrated into another device in the MPS 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processor 132a"), a memory 132b, software components 132c, and a network interface 132d. The processor 132a can be configured to perform functions relevant to facilitating user access, control, and configuration of the MPS 100. The memory 132b can comprise data storage that can be loaded with one or more of the software components executable by the processor 132a to perform those functions. The software components 132c can comprise applications and/or other executable software configured to facilitate control of the MPS 100. The memory 132b can be configured to store, for example, the software components 132c, media playback system controller application software, and/or other data associated with the MPS 100 and the user.

The network interface 132d is configured to facilitate network communications between the control device 130a and one or more other devices in the MPS 100, and/or one or more remote devices. In some embodiments, the network interface 132d is configured to operate according to one or more suitable communication industry standards (e.g., infrared, radio, wired standards including IEEE 802.3, wireless standards including IEEE 802.11a, 802.11b, 802.11g, 802.12, 802.11ac, 802.15, 4G, LTE). The network interface 132d can be configured, for example, to transmit data to and/or receive data from the playback devices 110, NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 130a to one or more of the playback devices 110. The network interface 132d can also transmit and/or receive configuration changes such as, for example, adding/removing one or more playback devices 110 to/from a zone, adding/removing one or more zones to/from a zone group, forming a bonded or consolidated player, separating one or more playback devices from a bonded or consolidated player, among others.

The user interface 133 is configured to receive user input and can facilitate control of the MPS 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system. Additional examples are also possible.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

III. Example Headphone Devices

In some embodiments a playback device may be a headphone device. Aspects of the present disclosure relate to a headphone device (e.g., WIFI enabled headphones, WIFI and BLUETOOTH enabled headphones, etc.) that includes a housing having a non-flat surface for receiving touch inputs.

Figure 2A:
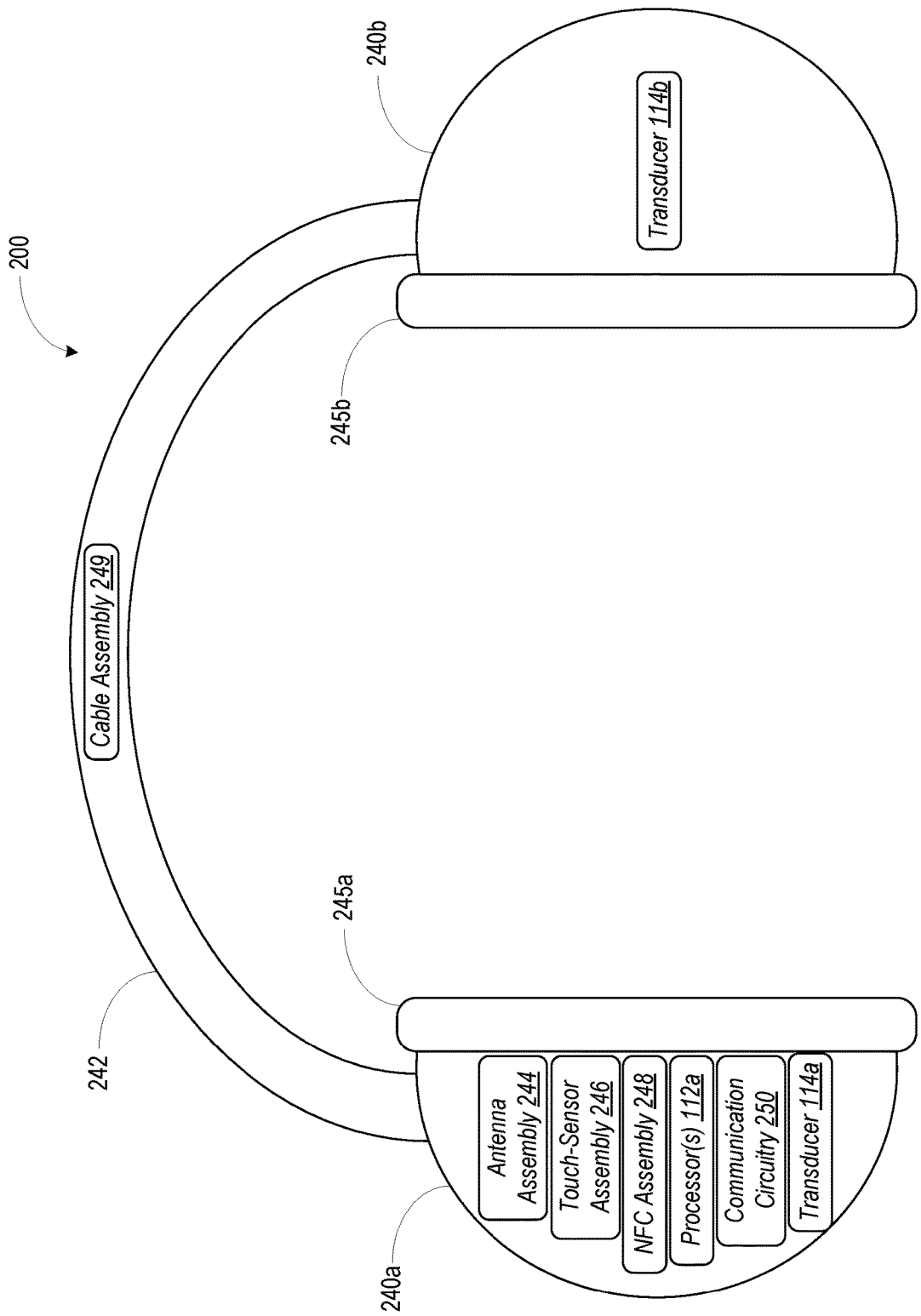
FIG. 2A is a schematic diagram of an example headphone device.

FIG. 2A shows some aspects of an example headphone device 200 according to some embodiments. The headphone device 200 may be implemented as a wearable device such as over-ear headphones, in-ear headphones, or on-ear headphones. As shown, the headphone device 200 includes a headband 242 that couples a first earpiece 240a to a second earpiece 240b. Each of the earpieces 240a and 240b may house any portion of the electronic components in the headphone device 200 (e.g., transducers 114a and 114b, amplifiers, filters, processor(s) 112a, memory, receivers, transmitters, switches, etc.). Additionally, one or both of the earpieces 240a and 240b may house an antenna assembly 244, a touch sensor assembly 246, a near-field communication (NFC) assembly 248, and/or communication circuitry 250. The touch sensor assembly 246 can include a capacitive touch sensor configured to receive user input for playback control and other operation of the headphones 200. Detailed example embodiments of the touch sensor assembly 246 are provided in FIGS. 3A and 3B. In some example embodiments, one or more of the earpieces 240a and 240b may further include additional user interface components for controlling audio playback, volume level, and other functions, for example, buttons, switches, microphones for voice input, etc. In some embodiments, the collection of above-listed components is-said be enclosed within a headphone housing, which includes one or more of, or a combination of, the first and second earpieces 240a, 240b and the headband 242.

Although the illustrated embodiment shows several components housed within the first earpiece 240a (e.g., the antenna assembly 244, touch sensor assembly 246, NFC assembly 248, processor(s) 112a, and communication circuitry 250), in various embodiments some or all of these components can be housed in the other earpiece 240b. In some embodiments, some or all of these components can be duplicated in the second earpiece 240b, such that each of the first and second earpieces 240a and 240b has, for example, an antenna assembly 244, a touch sensor assembly 246, an NFC assembly 248, a processor 112a, and/or communication circuitry 250.

As shown in FIG. 2A, the headphone device 200 may further include ear cushions 245a and 245b that are coupled to earpieces 240a and 240b, respectively. The ear cushions 245a and 245b may provide a soft barrier between the head of a user and the earpieces 240a and 240b, respectively, to improve user comfort and/or provide acoustic isolation from the surrounding environment (e.g., passive noise reduction (PNR)).

In some embodiments, the communication circuitry 250 may comprise any of a variety of electronic components that enable transmission and/or receipt of wireless signals via the antenna assembly 244. Examples of such components include receivers, transmitters, processors 112a, memory, amplifiers, switches, and/or filters. The antenna assembly 244 can include one or more antennas configured to communicate over one or more wireless networks. Example wireless networks include: a WIFI network, a BLUETOOTH network, an LTE network, a Z-Wave network, a 5G network, and a ZIGBEE network.

In some embodiments, the antenna assembly 244 includes one or more multi-band antennas configured to operate on several frequency bands (e.g., two or more of: the 2.4 GHz band, the 5 GHz band, or the 6 GHz band), such as a dual-band inverted-F antenna (IFA). Further, in some examples, one or more antennas of the assembly 244 may be passive multi-band antennas, active multi-band antennas, or a combination thereof. In some embodiments, the antenna assembly 244 can include a single-band antenna configured to operate on a single frequency band (e.g., one of: the 2.4 GHz band, the 5 GHz band, or the 6 GHz band).

It should be appreciated that the headphone device 200 may employ any number of antennas and is not limited to implementations with any particular number of antennas. For example, the headphone device 200 may comprise two antennas for communication over WIFI and a third antenna for communication over BLUETOOTH. Additionally or alternatively, the headphone device 200 may comprise an additional antenna to enable near-field communication, for example as part of the NFC assembly 248.

The communication circuitry 250 is further configured to cause the headphone device 200 to wirelessly communicate with at least one external device, such as a control device 130 or other network device, based at least in part on the current mode of operation. The control device 130 may be, for example, a smartphone, tablet, computer, etc.

In some embodiments, the headphone device 200 may be configured to operate in various operational modes dependent upon media-type and/or synchronized devices (e.g., music, home theater, etc.). For example, one mode may be a synchronized playback mode where the headphone device 200 plays back audio content that is synchronized with playback of content output by another device. In one example, the synchronized playback mode includes a first headphone device playing back audio that is synchronized with a television set's playback of video corresponding to the audio that the first headphone device is playing back. In some embodiments, the audio may be home theater or surround sound audio. In another example, the synchronized playback mode includes the first headphone device playing back audio that is synchronized with a second headphone device's playback of the same audio that the first headphone device is playing. In yet another example, the synchronized playback mode includes the first playback device playing back audio that is synchronized with both (i) a television set's playback of video corresponding to the audio that the first headphone device is playing back and (ii) a second headphone device's playback of the same audio that the first headphone device is playing. Another mode may be a non-synchronized playback mode where the first headphone device plays back audio content that is not synchronized with content output by other devices (e.g., headphone device 200 playing only audio content without synchronization to other devices).

Additionally or alternatively, operating in a synchronized playback mode, such as a home theater mode, may involve pairing the headphone device 200 with other playback devices described herein. In these examples, the headphone device 200 may, for example, be grouped in a playback zone. An example playback scheme may involve muting the other playback devices in the playback zone while the headphone device 200 is paired. For example, when the headphone device 200 is paired in a playback zone with a home theater system comprising multiple playback devices (e.g., a sound bar, a subwoofer, and a plurality of satellite speakers), the other multiple playback devices may not play back home theater audio while the headphones are paired with the playback zone and playing back the home theater audio. In operation, the other multiple playback devices may mute their playback of the home theater audio, or alternatively, a home theater controller (e.g., a soundbar, surround sound processor, or other device configured to coordinate surround sound playback of the home theater audio among the multiple playback devices) may simply not transmit or otherwise provide the home theater audio information to the multiple playback devices for playback while the headphone is paired in the playback zone and configured to playback the home theater audio. In some embodiments, the surround sound controller transmits or otherwise provides the home theater audio to the headphones and coordinates the headphone's synchronized playback of the home theater audio with the play back of the home theater audio's corresponding video by the television or other display screen.

In the embodiment shown in FIG. 2A, the first transducer 114a and the communication circuitry 250 are in the first earpiece 240a and the second transducer 114b is in the second earpiece 240b. To connect the second transducer 114b in the second earpiece 240b with components in the first earpiece 240a, the headband includes a cable assembly 249 that connects circuitry disposed within the first earpiece 240a to circuitry disposed within the second earpiece 240b). The cable assembly 249 may be constructed as, for example, a set of one or more cables that couple (e.g., electrically couple) one or more components at least partially housed by the first earpiece 240a with one or more components at least partially housed by the second earpiece 240b. In embodiments in which a second antenna assembly is disposed in the second earpiece 240b, the cable assembly 249 connects the second antenna in the second earpiece 240b with the communication circuitry 250 in the first earpiece 240a.

In some example embodiments, the headphone device 200 may further include one or more microphones, such as microphones 115 (FIG. 1F). The microphones 115 may be disposed within one or both earpieces 240a and 240b. Further, when equipped with the microphones 115, headphone device 200 can operate as an NMD configured to receive voice input from a user and correspondingly perform one or more operations based on the received voice input. Additionally or alternatively, the microphones 115 may be used for active noise cancellation (ANC) and/or active noise reduction (ANR).

Figure 2B:
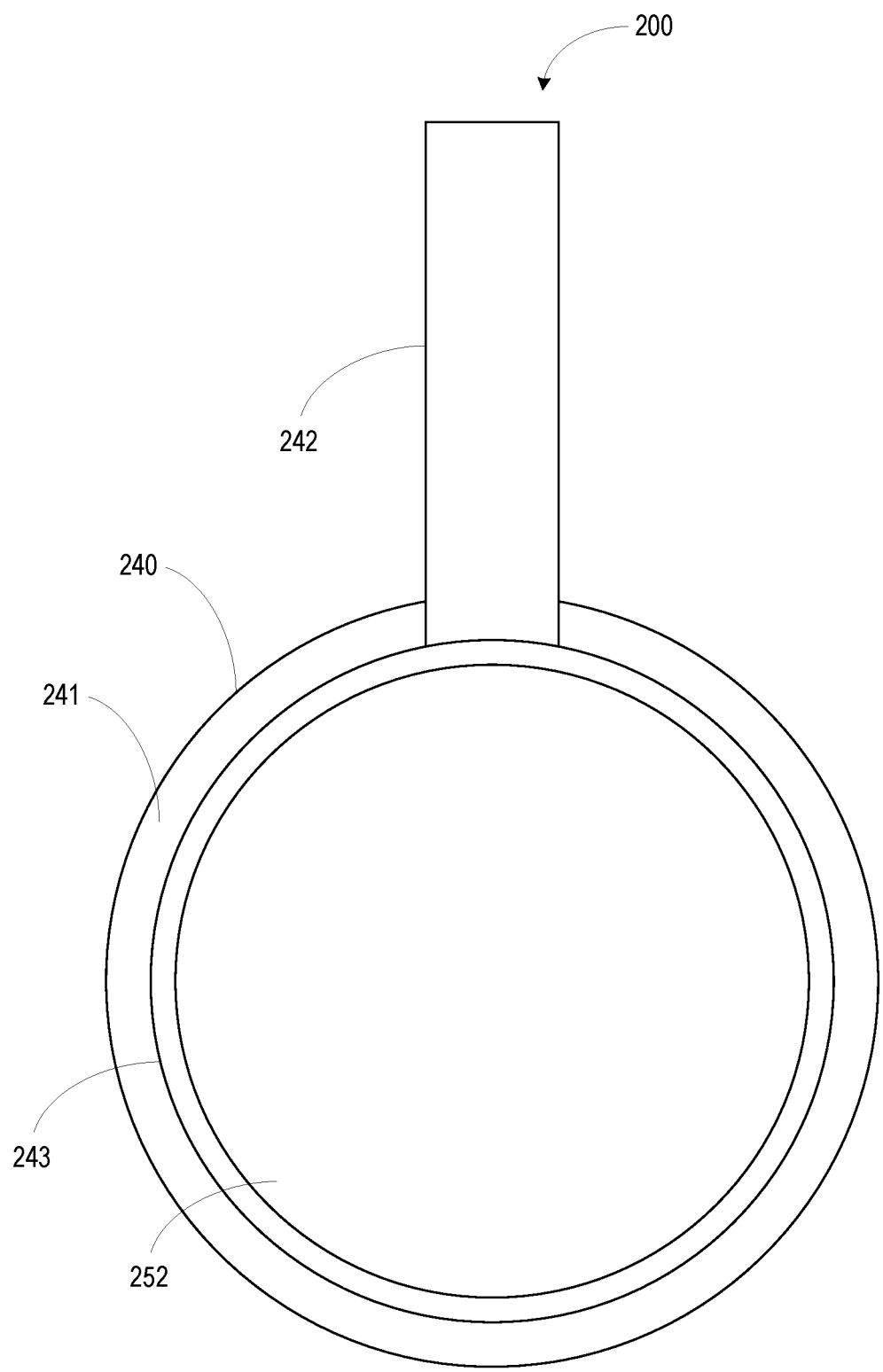
FIG. 2B is a schematic diagram of an example headphone device.

Referring to FIG. 2B, in some embodiments the earpieces 240a and 240b may include a first member 243 attached to the headband 242 and a second member 241 that pivots relative to the first member 243. In these examples, the ear cushions 245a and 245b may be disposed, for example, on the second member 241, closer to the user/wearer's head. Any of the circuitry and electrical components described herein may be disposed in either the first member 243 or the second member 241. For example, the antenna assembly 244 may be disposed in the first member 243.

As seen in FIG. 2B, the earpiece 240 can include a touch-sensitive input area 252 disposed over a laterally outward surface of the earpiece 240. As described in more detail below, this touch-sensitive input area 252 can be part of a touch sensor assembly, and configured to detect a user's touch via a capacitive sensing circuit or other proximity sensing technique. In some embodiments, the touch-sensitive input area 252 is positioned laterally outward with respect to the other electronic components to facilitate detection of the user's touch without the interference of any intervening components.

It should be appreciated that, in some instances, the headphone devices described herein may be implemented as a hearable device. Hearable devices may include those headphone devices that are configured to provide a hearing enhancement function while also supporting playback of media content (e.g., streaming media content from a user device over a PAN, streaming media content from a streaming music service provider over a WLAN and/or a cellular network connection, etc.). In some instances, a hearable device may be implemented as an in-ear headphone device that is configured to playback an amplified version of at least some sounds detected from an external environment (e.g., all sound, select sounds such as human speech, etc.).

It should also be appreciated that one or more of the playback devices 110 may take the form of other wearable devices separate and apart from a headphone. Wearable devices may include those devices configured to be worn about a portion of a subject (e.g., a head, a neck, a torso, an arm, a wrist, a finger, a leg, an ankle, etc.). For example, the playback devices 110 may take the form of a pair of glasses (e.g., smart-glasses) including a frame front (e.g., configured to hold one or more lenses), a first temple rotatably coupled to the frame front, and a second temple rotatably coupled to the frame front. In this example, the pair of glasses may comprise one or more transducers integrated into at least one of the first and second temples and configured to project sound towards an ear of the subject. As another example, the playback devices 110 may take the form of a smart watch including a watch band and a watch body. In this example, the smart watch may comprise one or more transducers integrated into at least one of the watch band or the watch body and configured to project sound towards an ear of the subject.

IV. Example Touch Sensor Assemblies

As described above in connection with FIG. 2B, the touch-sensitive input area 252 of the headphone device 200 may be disposed over an outward surface of the earpiece 240. For aesthetic and/or functional purposes, the outward surface of the earpiece 240 may be a non-flat surface, such as a convex surface, a concave surface, or some other curved surface. In order to provide the touch-sensitive input area 252 on the non-flat outward surface of the earpiece 240, the headphone device 200 may include touch-sensitive electronics on the corresponding inward surface of the earpiece 240, which may be similarly non-flat. For example, if the outward surface of the earpiece 240 is convex, then the corresponding inward surface may be concave.

When including touch-sensitive electronics on a non-flat surface, such as the inward surface of the earpiece 240, certain difficulties may arise. Touch-sensitive electronic components may be fabricated on a flexible substrate (e.g., a flexible circuit board), but such flexible substrates are typically flat. And while a flexible substrate may conform well to surfaces that are curved along a single dimension, such as a U-shaped surface, flexible substrates do not conform well to surfaces curved along multiple dimensions, such as a convex or concave surface.

Conforming a flexible substrate to a surface curved along multiple dimensions may cause the flexible substrate to wrinkle in certain areas. These wrinkles may be detrimental to the functionality of the touch-sensitive electronic components. For instance, as explained in further detail below, the touch-sensitive electronic components may include an array of sensor electrodes. Wrinkles in the array of electrodes may cause individual electrodes to become misaligned relative to other electrodes in the array and/or relative to the surface of the earpiece 240. Such misalignment may result in inaccurate or failed detection of touch inputs.

To address these issues, the present disclosure relates to a flat flexible circuit board that is designed to better conform to a non-flat surface, such as a convex or concave surface. While the examples disclosed herein are described in connection with a headphone device, embodiments of the flat flexible circuit board can also be applied in connection with non-flat surfaces of various other devices, such as any of the devices described herein (e.g., playback devices, computing devices, etc.).

Figure 3A:
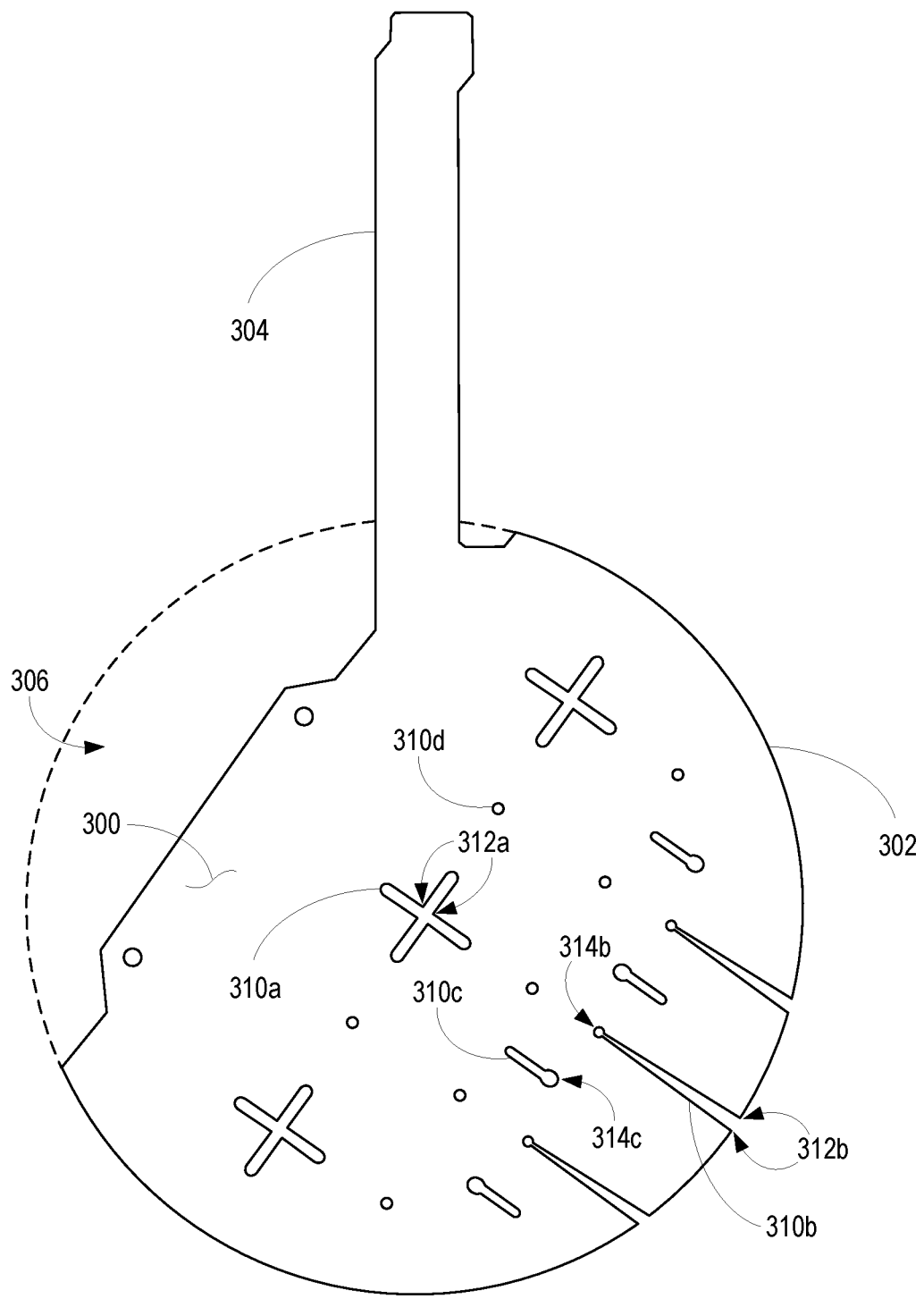
FIG. 3A is a schematic diagram of an example flexible circuit board.

FIG. 3A illustrates an example flexible circuit board 300 configured to conform to a non-flat surface, such as the inward surface of the earpiece 240. For instance, the flexible circuit board 300 may be flat (e.g., when originally manufactured) and configured to conform to a non-flat surface of a device (e.g., during assembly of the device) with minimal (if any) wrinkling and/or bubbling. The flexible circuit board 300 includes a flexible substrate that can be fabricated using various flexible insulators, such as polyimide, polyester, polyethylene naphthalate (PEN), polyethylene terephthalate (PET), solder mask, photoimageable coverlay (PIC), or screen-printed dielectrics. However, these examples are merely illustrative, and any currently known or later developed insulators for use in flexible circuits may be used as well.

As shown, the flexible circuit board 300 includes a first portion 302 and a second portion 304. The first portion 302 may be similar in shape and size to the touch-sensitive input area 252 on the earpiece 240. In the present example, the first portion 302 is at least partially circular in shape with a radius substantially similar or equal to the radius of the touch-sensitive input area 252. The first portion 302 is only partially circular, as it includes a cutout area 306 indicated by dashed lines. The cutout area 306 may align with the positioning of one or more wireless communication elements, such as the antenna assembly 244 and/or the NFC assembly 248. Aligning these wireless communication elements with the cutout area 306 may reduce interference from conductive elements of the circuit board 300 and thereby improve operation of the wireless communication elements. In other examples, the first portion 302 of the circuit board 300 may be fully circular or otherwise fully correspond in shape and size to the touch-sensitive input area 252 on the earpiece 240, such as in examples where the earpiece 240 does not include any wireless communication elements and/or the wireless communication elements are directly incorporated into the capacitive touch electrodes as described in U.S. Patent Publication No. 2021/0089265 published on Mar. 25, 2021, and titled "Capacitive Touch Sensor with Integrated Antenna(s) for Playback Devices," which is hereby incorporated by reference in its entirety.

In addition to the cutout area 306 for reducing interference with wireless communication elements, the first portion 302 of the circuit board 300 further includes a number of other cutouts for improving the conformability of the circuit board 300 to a non-flat surface, such as the inward surface of the earpiece 240. In the present example, the first portion 302 of the circuit board 300 includes three cross-shaped cutouts 310a, three triangular cutouts 310b, four linear cutouts 310c, and seven circular cutouts 310d, collectively referred to herein as cutouts 310. It should be understood that the particular arrangement of the cutouts 310 described herein, including the shapes, sizes, positions, orientations, and number of the cutouts 310, is meant to be illustrative, and other arrangements of the cutouts 310 that improve the conformability of the circuit board 300 to non-flat surfaces are contemplated as well.

As shown in FIG. 3A, the cross-shaped cutouts 310a may be arranged near a center of the first portion 302 of the circuit board 300 and/or positioned along or near an axis that passes through the center of the first portion 302. Positioning the cross-shaped cutouts 310a near the center of the first portion 302 may be advantageous for conforming the circuit board 300 to a convex or concave surface. Conforming the first portion 302 of the circuit board 300 in this manner imposes an inward force toward the center of the first portion 302, and the presence of a cross-shaped cutout 310a provides room for vertices 312a of the cross-shaped cutout 310a to contract inwardly toward the center of the first portion 302 in response. The contraction room provided by the cross-shaped cutout 310a may reduce or prevent a wrinkling of the circuit board 300 that would otherwise occur without the presence of the cross-shaped cutout 310a.

The triangular cutouts 310b may be arranged at an edge of the first portion 302 of the circuit board 300. As shown, the edge of the circuit board 300 may serve as the base of each of the triangular cutouts 310b, which may point inward toward a central area of the first portion 302. In the illustrated example, the triangular cutouts 310b point inward toward the axis on which the cross-shaped cutouts 310a are arranged. Positioning the triangular cutouts 310b in this manner may be advantageous for conforming the circuit board 300 to a convex or concave surface because conforming the first portion 302 of the circuit board 300 to a convex or concave surface effectively shrinks the circumference of the first portion 302. The triangular cutouts 310b provide room for vertices 312b of the bases of the triangular cutouts 310b to contract toward one another, thereby shrinking the effective circumference of the first portion 302. Without this contraction room, the first portion 302 may wrinkle at its edges in order to reduce its circumference when conforming to a non-flat surface, such as a convex or concave surface.

The linear cutouts 310c and circular cutouts 310d may be interspersed among the cross-shaped cutouts 310a and/or triangular cutouts 310b to provide additional relief from compressive forces imposed on the circuit board 300 when conforming the circuit board 300 to a non-flat surface. As depicted, some or all of the linear cutouts 310c may be positioned partially or wholly in between and/or adjacent to the triangular cutouts 310b while remaining offset from the edge of the circuit board 300 and located more inwardly toward the central region of the first portion 302 where the cross-shaped cutouts 310a are positioned. In some implementations, the circular cutouts 310d may be positioned even more inwardly than the linear cutouts 310c, closer to the cross-shaped cutouts 310a and/or aligned with and in between the cross-shaped cutouts 310a.

Further, in some implementations, some or all of the cross-shaped cutouts 310a, triangular cutouts 310b, or linear cutouts 310c may include circular cutouts at one or more ends of the respective cutouts 310. For instance, as shown, the triangular cutouts 310b may include circular cutouts 314b at the vertices of the triangular cutouts 310b, and the linear cutouts 310c can include circular cutouts 314c at one or both ends of the linear cutouts 310c. While the cross-shaped cutouts 310a are not shown as including circular cutouts at one or more ends of the cross-shaped cutouts 310a, the present disclosure contemplates such an implementation. Including circular cutouts in this manner may further reduce wrinkling when conforming the circuit board 300 to a non-flat surface.

With the arrangement of the cutouts 310 depicted in FIG. 3A, the circuit board 300 has room to expand and contract when conforming to a non-flat surface, which may reduce or prevent a wrinkling of the circuit board 300. Additionally, the cutouts 310 provide venting for releasing air pockets trapped between the circuit board 300 and the non-flat surface, which may reduce or prevent a bubbling of the circuit board 300. In the examples described herein, any or all of the cutouts 310 may be formed using various fabrication processes now known or later developed, such as milling processes, drilling processes, etching processes, or cutting processes.

As further shown in FIG. 3A, the second portion 304 of the circuit board 300 may be a substantially linear strip of the circuit board 300 that extends laterally from a side of the first portion 302 of the circuit board 300. The second portion 304 may be positioned within the headband 242 of the headphone device 200. As such, a width and length of the second portion 204 may be no greater than a width and length of the headband 242. As will be described in further detail below, the second portion 304 of the circuit board 300 may include a number of conductive traces for carrying signals from touch-sensitive electrodes arranged on the first portion 302 to various other electronic components.

Figure 3B:
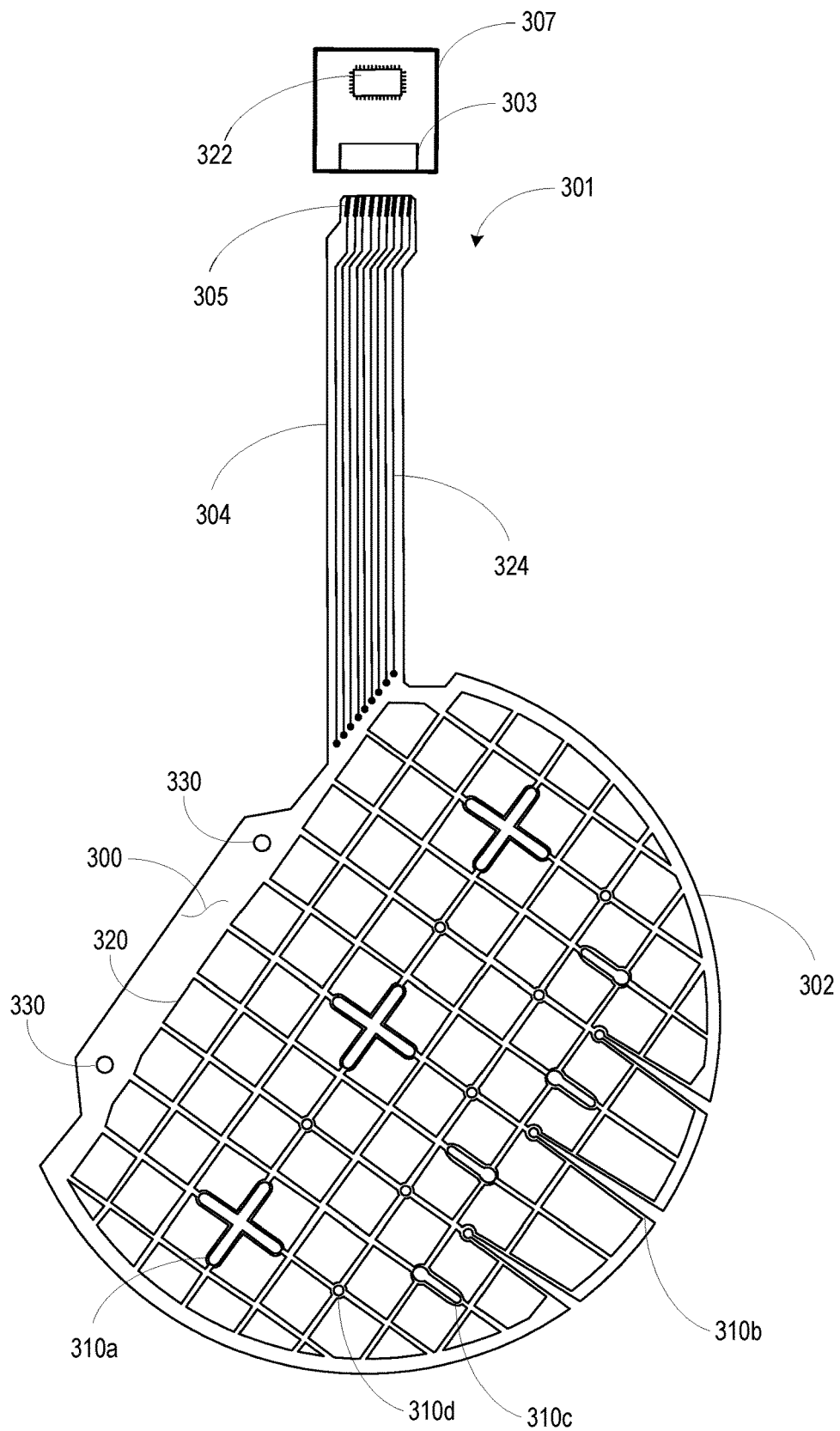
FIG. 3B is a schematic diagram of an example flexible touch sensor assembly.

FIG. 3B illustrates an example flexible electronic assembly 301 that comprises the flexible circuit board 300 (of FIG. 3A) and various electronic components. As shown, the flexible electronic assembly 301 may be configured to engage a connector 303 on an auxiliary circuit board 307 that includes a capacitive sensing circuit 322. The flexible electronic assembly 301 may be configured as a flexible touch sensor assembly for detecting and/or receiving one or more different types of user input. For example, the touch sensor assembly can be configured to operate as a button (e.g., detecting a user's touch in a binary fashion), a slider (e.g., detecting movement of a user's finger across a single axis), a trackpad (e.g., detecting a user's touch at multiple points over a 2-dimensional area), or any combination thereof. Additionally or alternatively, the capacitive sensing techniques employed can vary in different embodiments. For example, the touch sensor assembly can rely on self-capacitance, mutual capacitance, or a hybrid approach that combines self-capacitance and mutual capacitance.

As shown in FIG. 3B, the touch sensor assembly can include an array of capacitive touch sensor electrodes 320 arranged on the first portion 302 of the flexible circuit board 300. The electrodes 320 may comprise conductive elements, for example made of copper or other suitable conductive materials. A number of conductors 324 are electrically coupled to the electrodes 320 and extend onto the second portion 304 of the flexible circuit board 300. The conductors 324 terminate at a set of respective electrical contacts 305 at a distal end of the second portion 304 of the flexible circuit board 300.

The capacitive sensing circuit 322 is arranged on an auxiliary circuit board 307. The auxiliary circuit board 307 may have a different form factor than the flexible circuit board 300. For example, the auxiliary circuit board 307 may have a rigid substrate instead of a flexible substrate. The auxiliary circuit board 307 includes a connector 303 configured to engage and make electrical contact with the contacts 305. The connector 303 may, for example, be a flexible printed circuit (FPC) connector or any other connector capable of connecting the auxiliary circuit board 307 to the contacts 305. When the connector 303 and the contacts 305 are engaged, the capacitive sensing circuit 322 is electrically coupled to the electrodes 320 via the conductors 324.

The capacitive sensing circuit 322 is configured to deliver capacitive sensing signals to the electrodes 320 via the conductors 324 (and/or the contacts 305). The capacitive sensing signals can be a relatively low-frequency oscillatory signal, for example having a frequency of less than about 10 MHz (e.g., between about 1-10 MHz, between about 2-5 MHz, or between about 3-4 MHz). The capacitive sensing circuit 322 additionally detects changes in capacitance indicative of a user's skin (e.g., a fingertip) coming into proximity with the electrodes 320. The capacitive sensing circuit 322 may be integrated into, for example, a system-on-a-chip (SoC) such as a programmable system-on-a-chip (PSoC).

Based on the detected changes in capacitance at particular electrodes 320, the capacitive sensing circuit 322 may determine a type of user touch input. For instance, the capacitive sensing circuit 322 may determine a location where the user touched the touch-sensitive input area 252 based on detecting a capacitance change for a particular electrode 320. By monitoring capacitance changes over time, the capacitive sensing circuit 322 may determine movements of the user's touch on the touch-sensitive input area 252. For instance, the capacitive sensing circuit 322 may detect a swipe input based on determining capacitance changes for a set of electrodes 320 in a linear arrangement over a predetermined period of time. As another example, the capacitive sensing circuit 322 may determine a long press at a particular location based on determining a capacitance change at a particular electrode 320 for a threshold amount of time. Other examples are possible as well.

Once the capacitive sensing circuit 322 has determined the type of user touch input, the capacitive sensing circuit 322 may transmit data indicating the determined type of input to another processor, such as a host processor (e.g., the processor 112a of the headphone device 200). The capacitive sensing circuit 322 may be coupled to the processor 112a by a communication bus or some other communication path. In some implementations, the processor 112a may be positioned in a different earpiece of the headphone device 200 than the touch sensor assembly. For example, the touch sensor assembly may be arranged in earpiece 240a, and the processor 112a may be arranged in earpiece 240b. In such examples, the communication bus that couples the capacitive sensing circuit 322 to the processor 112a may pass through the headband 242 and may be included as part of the cable assembly 249.

After receiving the data indicating the type of user touch input, the processor 112a may control various functions of the headphone device 200 based on the indicated type of the input. For instance, in some implementations, the type of input may be a command to initiate playback of media content, such as a touch of a play button. Based on receiving data indicating this input type, the processor 112a may cause the transducers 114 to initiate playback of media content. In other implementations, the type of input may be a command to modify playback of media content that is currently being played back. Examples of these input types include a volume adjustment input (e.g., a swipe input), a pause input (e.g., a touch of a pause button), or a skip forward/backward input (e.g., a touch of a skip button or a predetermined gesture, such as a double tap in a particular zone of the touch-sensitive input area 252). In each of these examples, the processor 112a may cause the transducers 114 to modify playback accordingly based on the type of the user input. Further, in some examples, the input type may correspond to functions that are not related to media playback. For instance, the input type may be an input for invoking a VAS associated with the headphone device 200, such as the AMAZON® VAS, the GOOGLE® VAS, or the APPLE® VAS. In this example, based on receiving the input for invoking a VAS, the processor 112a may cause a microphone of the headphone device 200 to start capturing voice input for speech processing by the VAS, as described above in connection with FIGS. 1B and 1F. However, these examples are meant to be illustrative, and other example types of user inputs and corresponding actions are contemplated herein as well.

As further shown in FIG. 3B, the cutouts 310 may be strategically positioned to reduce their impact on the functionality of the capacitive touch sensor electrodes 320. For instance, the array of capacitive touch sensor electrodes 320 includes the electrodes 320 arranged into a number of columns and rows, and the cutouts 310 may be positioned at various intersections of these columns and rows and/or in gaps between laterally adjacent or diagonally adjacent electrodes 320 to reduce an overlap between the cutouts 310 and the electrodes 320.

Figure 4:
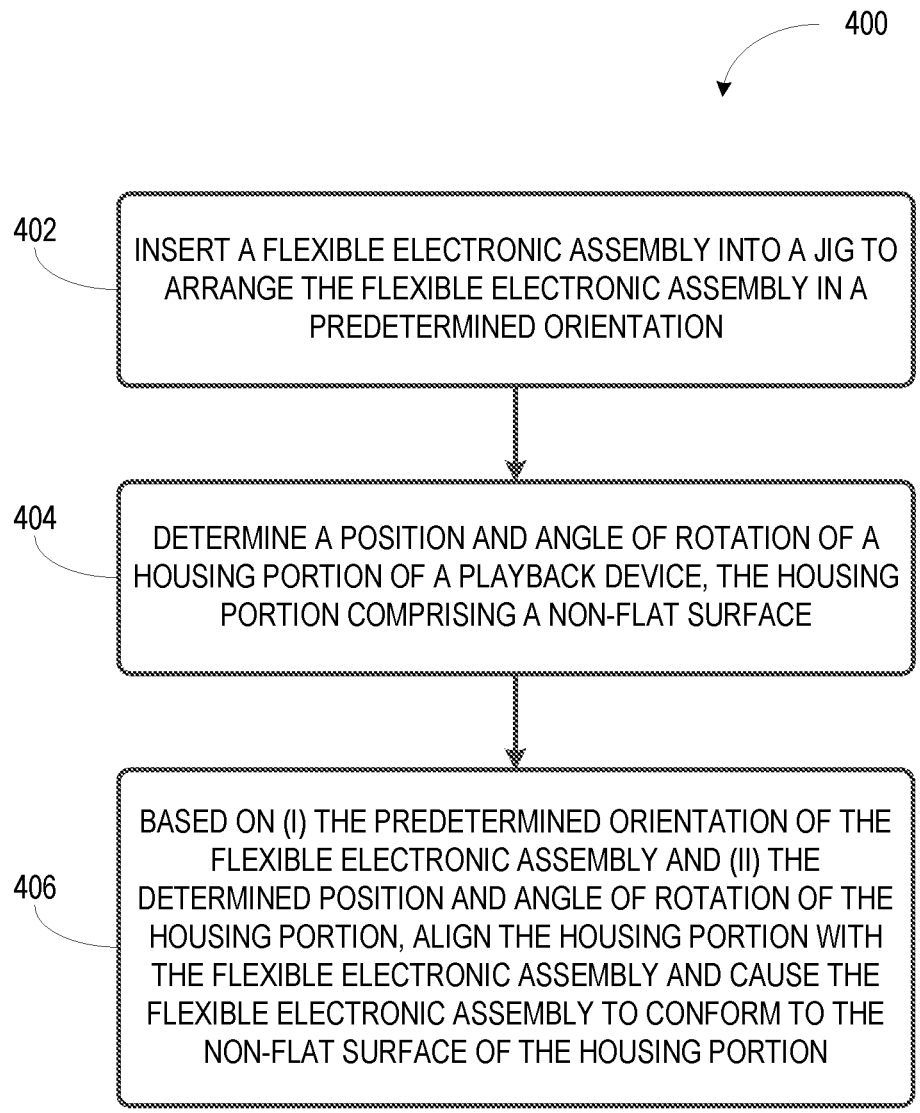
FIG. 4 is a flowchart showing example operations for conforming a flexible touch sensor assembly to a non-flat surface of a housing portion of a playback device.

FIG. 4 is a flowchart 400 that illustrates an example implementation for conforming a flat flexible electronic assembly to a non-flat surface. The electronic assembly may be, for example, any of the touch-sensitive assemblies described herein, such as the flat flexible circuit board 300 depicted in FIGS. 3A and 3B. The non-flat surface may be, for example, a non-flat surface on a housing of any of the playback devices described herein, such as an inward facing surface of the earpiece 240 of the headphone device 200 depicted in FIGS. 2A and 2B, or any non-flat surface on any of the playback devices 110, NMDs 120, or control devices 130 depicted in FIGS. 1A-1H.

Beginning at block 402, the method 400 involves inserting the flexible electronic assembly into a jig to arrange the flexible electronic assembly in a predetermined orientation. The jig and/or the flexible electronic assembly may include one or more interlocking components or other elements for maintaining the flexible electronic assembly in the predetermined orientation. For instance, referring back to FIG. 3B, the circuit board 300 may include designated cutouts 330 configured to engage with corresponding pins of the jig. However, this example is merely illustrative, and any other known method of positioning the flexible electronic assembly in the predetermined orientation are contemplated herein as well.

At block 404, the method 400 involves determining a position and angle of rotation of a housing portion of a playback device, where the housing portion includes a non-flat surface, such as a convex or concave surface. In line with the discussion above, the housing portion of the playback device may take the form of the touch-sensitive surface 252 of the earpiece 240 of the headphone device 200.

Typically, it may be desirable for an outward-facing touch-sensitive surface of the housing portion to be a smooth surface, as smooth touch-sensitive surfaces may provide an improved user experience over rough surfaces or surfaces with protruding or otherwise uneven elements. Additionally, it may also be desirable for the opposite inward-facing surface of the housing portion to be similarly smooth so that the array of capacitive electrodes of the touch sensor assembly can evenly engage the surface for accurately detecting user inputs on the outward-facing surface. Further, for headphone devices, the housing portion may be symmetrical in shape, as is the case with the circular touch-sensitive surface 252 depicted in FIGS. 2A and 2B.

When working with such a smooth and symmetrical housing portion, it may be difficult to reliably and repeatedly position the housing portion in a predetermined orientation with a high degree of accuracy. One way to address this issue is to use an optical tracking system to determine a position and angle of rotation of the housing portion of the playback device. For instance, the optical tracking system may include an optical sensor, such as a camera, positioned at a fixed distance above the housing portion. Using images captured by the optical sensor, the optical tracking system may locate a physical center of the housing portion. Based on the determined center of the housing portion, the optical tracking system may determine the physical position of the housing portion.

Figure 5A:
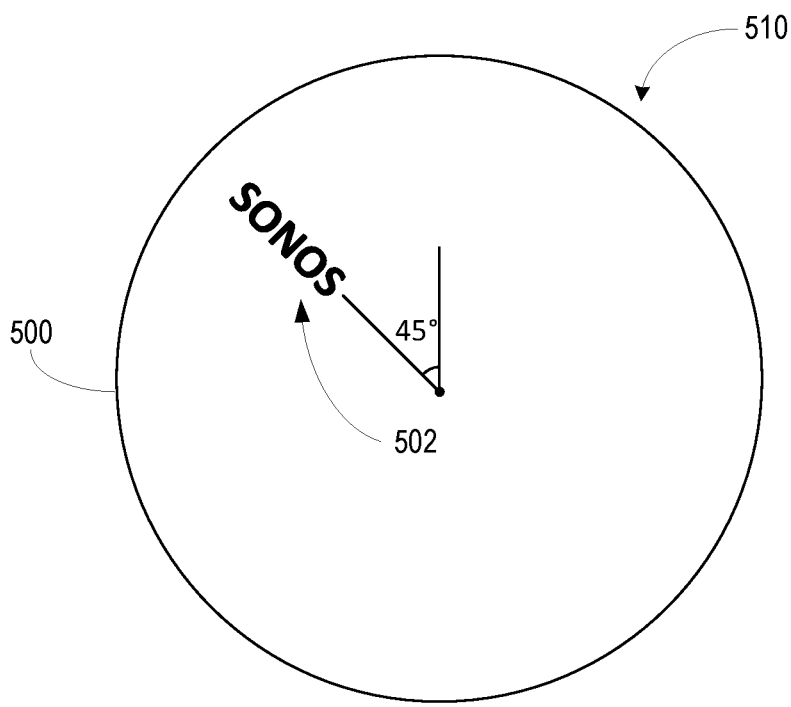
FIG. 5A is a schematic diagram of an example housing portion of a playback device.

In addition to determining the physical position of the housing portion, the optical tracking system may also determine the angle of rotation of the housing portion. While the housing portion may be substantially smooth, the housing portion may still include one or more markings that the optical tracking system may use as a fiducial marker. Referring to FIG. 5A, an example housing portion 500 is shown in a first orientation 510. The housing portion 500 includes a "SONOS" brand label 502, which the optical tracking system may use as a fiducial marker for determining an angle of rotation of the housing portion 500. While the present example contemplates using the brand label 502 as a fiducial marker, the housing portion 500 may include various other examples of fiducial markers as well. As shown in FIG. 5A, the optical tracking system may determine that the brand label 502 is rotated counterclockwise 45 degrees from a desired angle of rotation.

Referring back to FIG. 4, at block 406, the method 400 involves, based on (i) the predetermined orientation of the flexible electronic assembly and (ii) the determined position and angle of rotation of the housing portion, aligning the housing portion with the flexible electronic assembly and causing the flexible electronic assembly to conform to the non-flat surface of the housing portion.

Figure 5B:
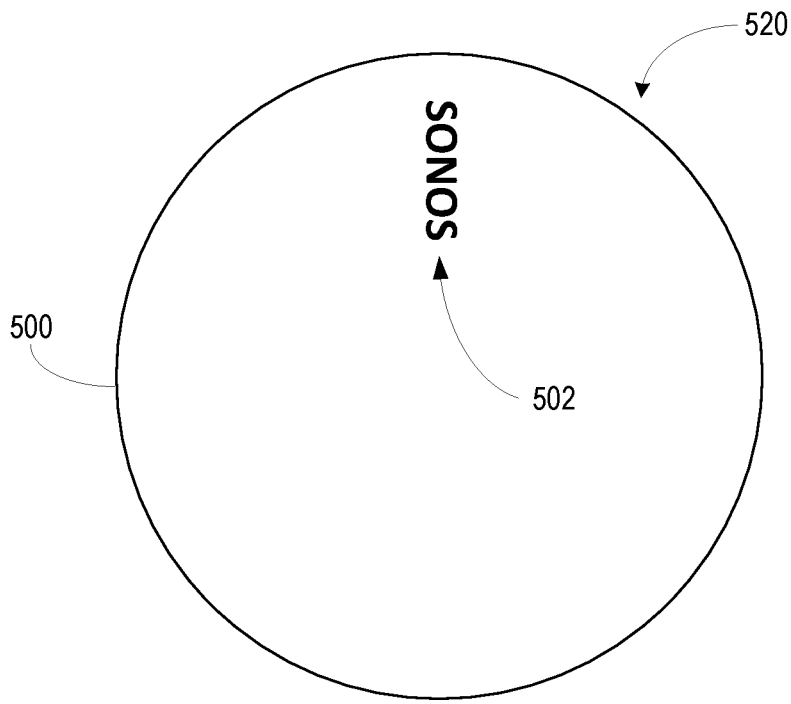
FIG. 5B is a schematic diagram of an example housing portion of a playback device.

Once the optical tracking system has determined the position and angle of rotation of the housing portion 500, as described above in connection with FIG. 5A, the optical tracking system may cause the housing portion to be rotated to a desired orientation 520, as depicted in FIG. 5B. To facilitate this, the optical tracking system may include, or be in communication with, a mechanical system for repositioning the housing portion 500. For instance, the optical tracking system may include a robotic system, such as a robotic arm, that includes a number of servo motors for controlling movements of the robotic system with a high degree of accuracy. The robotic system may include a grabbing component, such as a suction cup or a vacuum suction component, for picking up the housing portion 500. The grabbing component may be positioned at a known location in physical space, and, using the known location of the grabbing component and the determined location and orientation of the housing portion 500, the optical tracking system may cause the robotic system to pick up and rotate the housing portion 500 into the desired orientation 520.

In addition to rotating the housing portion 500 into the desired orientation 520, the robotic system can be configured to move the housing portion 500 from its determined position to a position that aligns with the predetermined orientation of the flexible electronic assembly. While the housing portion 500 and the flexible electronic assembly are aligned, the robotic system can physically engage the housing portion 500 with the flexible electronic assembly, causing the flexible electronic assembly to conform to the non-flat surface of the housing portion. In some implementations, this may involve pressing the housing portion 500 onto the flexible electronic assembly with a predetermined amount of force. To form a robust engagement between the housing portion 500 and the flexible electronic assembly, one or both of the housing portion 500 and the flexible electronic assembly may be coated with an adhesive prior to this process.

As described above, the flexible electronic assembly may include an array of capacitive touch sensor electrodes as well as a number of cutouts positioned between respective electrodes in the array. For instance, as shown in FIGS. 3A and 3B, the flexible electronic assembly may include a number of cross-shaped cutouts 310a, triangular cutouts 310b, linear cutouts 310c, and/or circular cutouts 310d. And as further described above, the presence of these cutouts reduces a wrinkling and/or bubbling of the flexible electronic assembly when conforming the assembly to the non-flat surface of the housing portion 500.

FIG. 4 includes one or more operations, functions, or actions as illustrated by one or more of operational blocks. Although the blocks are illustrated in a given order, some of the blocks may also be performed in parallel, and/or in a different order than those described herein. Also, the various blocks may be combined into fewer blocks, divided into additional blocks, and/or removed based upon the desired implementation.

In addition, for the flowchart shown in FIG. 4 and other processes and methods disclosed herein, the diagrams show functionality and operation of one possible implementation of present embodiments. In this regard, each block may represent a module, a segment, or a portion of program code, which includes one or more instructions executable by one or more processors for implementing logical functions or blocks in the process.

The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long-term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the processes and methods disclosed herein, each block in FIG. 4 may represent circuitry and/or machinery that is wired or arranged to perform the specific functions in the process.

IV. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

V. Example Features (Feature 1) A playback device comprising: a housing portion comprising a non-flat surface; a flexible touch-sensitive electronic assembly comprising: a flexible substrate having a first portion and a second portion, wherein the second portion extends from the first portion, and wherein the first portion is at least partially disposed on the non-flat surface of the housing portion; an array of capacitive touch sensor electrodes arranged on the first portion of the flexible substrate; and a plurality of conductors that are electrically coupled to the array of capacitive touch sensor electrodes and that extend onto the second portion of the flexible substrate, wherein the first portion of the flexible substrate includes a plurality of cutouts, and each cutout of a subset of the plurality of cutouts is positioned between a respective set of two or more electrodes in the array of capacitive touch sensor electrodes; one or more audio drivers; at least one processor; at least one communication interface; at least one non-transitory computer-readable medium; and program instructions stored on the at least one non-transitory computer-readable medium that are executable by the at least one processor such that the playback device is configured to: receive, via the at least one communication interface, media content; cause the one or more audio drivers to play back the media content; detect, using the flexible touch-sensitive electronic assembly, a touch input; and after detection of the touch input, modify playback of the media content based on the touch input.

(Feature 2) The playback device of feature 1, wherein the plurality of cutouts include one or more linear cutouts, one or more cross-shaped cutouts, one or more triangular cutouts, or one or more circular cutouts.

(Feature 3) The playback device of feature 1, wherein the plurality of cutouts include one or more linear cutouts, and wherein at least one linear cutout of the one or more linear cutouts includes a circular cutout at one or both ends of the linear cutout.

(Feature 4) The playback device of feature 1, wherein the plurality of cutouts include one or more cross-shaped cutouts, and wherein at least one linear cross-shaped cutout of the one or more cross-shaped cutouts includes a circular cutout at one or more ends of the cross-shaped cutout.

(Feature 5) The playback device of feature 1, wherein the plurality of cutouts include one or more triangular cutouts, and wherein at least one linear triangular cutout of the one or more triangular cutouts includes a circular cutout at a vertex of the triangular cutout.

(Feature 6) The playback device of feature 1, wherein the plurality of cutouts include one or more cross-shaped cutouts, wherein the array of capacitive touch sensor electrodes includes a plurality of electrode columns and a plurality of electrode rows, and wherein the one or more cross-shaped cutouts are positioned at one or more intersections of the electrode columns and electrode rows.

(Feature 7) The playback device of feature 1, wherein the plurality of cutouts include one or more triangular cutouts, and wherein at least one linear triangular cutout of the one or more triangular cutouts extends inward from an outer edge of the flexible substrate.

(Feature 8) The playback device of feature 1, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the playback device is configured to detect the touch input comprise program instructions that are executable by the at least one processor such that the playback device is configured to: determine, by the first processor, a type of the touch input based on one or more signals representing the touch input; and send, by the first processor to the second processor via the communication bus, data indicating the determined type of the touch input.

(Feature 9) The playback device of feature 8, wherein the program instructions that are executable by the at least one processor such that the playback device is configured to detect the touch input comprise program instructions that are executable by the at least one processor such that the playback device is configured to: determine, by the first processor, one or more of a location or a movement of the touch input; and determine, by the first processor, the type of the touch input based on the determined location or movement of the touch input.

(Feature 10) The playback device of feature 9, wherein the program instructions that are executable by the at least one processor such that the playback device is configured to modify playback of the media content based on the touch input comprise program instructions that are executable by the at least one processor such that the playback device is configured to: modify playback of the media content based on the determined type of the touch input.

(Feature 11) The playback device of feature 9, wherein the at least one non-transitory computer readable medium comprises a first memory storing a first portion of the program instructions and a second memory storing a second portion of the program instructions.

(Feature 12) A headphone device comprising: a housing portion comprising a non-flat surface, wherein the housing is an earpiece of the headphone device and the earpiece is attached to a headband of the headphone device; a flexible touch-sensitive electronic assembly comprising: a flexible substrate having a first portion and a second portion, wherein the second portion extends from the first portion, and wherein the first portion is at least partially disposed on the non-flat surface of the housing portion; an array of capacitive touch sensor electrodes arranged on the first portion of the flexible substrate; and a plurality of conductors that are electrically coupled to the array of capacitive touch sensor electrodes and that extend onto the second portion of the flexible substrate, wherein the first portion of the flexible substrate includes a plurality of cutouts, and each cutout of a subset of the plurality of cutouts is positioned between a respective set of two or more electrodes in the array of capacitive touch sensor electrodes; one or more audio drivers; at least one processor; at least one communication interface; at least one non-transitory computer-readable medium; and program instructions stored on the at least one non-transitory computer-readable medium that are executable by the at least one processor such that the headphone device is configured to: receive, via the at least one communication interface, audio content; cause the one or more audio drivers to play back the audio content; detect, using the flexible touch-sensitive electronic assembly, a touch input; and after detection of the touch input, modify playback of the audio content based on the touch input.

(Feature 13) The headphone device of feature 12, wherein the plurality of cutouts include one or more linear cutouts, one or more cross-shaped cutouts, one or more triangular cutouts, or one or more circular cutouts.

(Feature 14) The headphone device of feature 12, wherein the plurality of cutouts include one or more linear cutouts, and wherein at least one linear cutout of the one or more linear cutouts includes a circular cutout at one or both ends of the linear cutout.

(Feature 15) The headphone device of feature 12, wherein the plurality of cutouts include one or more cross-shaped cutouts, and wherein at least one linear cross-shaped cutout of the one or more cross-shaped cutouts includes a circular cutout at one or more ends of the cross-shaped cutout.

(Feature 16) The headphone device of feature 12, wherein the plurality of cutouts include one or more triangular cutouts, and wherein at least one linear triangular cutout of the one or more triangular cutouts includes a circular cutout at a vertex of the triangular cutout.

(Feature 17) The headphone device of feature 12, wherein the plurality of cutouts include one or more cross-shaped cutouts, wherein the array of capacitive touch sensor electrodes includes a plurality of electrode columns and a plurality of electrode rows, and wherein the one or more cross-shaped cutouts are positioned at one or more intersections of the electrode columns and electrode rows.

(Feature 18) The headphone device of feature 12, wherein the plurality of cutouts include one or more triangular cutouts, and wherein at least one linear triangular cutout of the one or more triangular cutouts extends inward from an outer edge of the flexible substrate.

(Feature 19) The headphone device of feature 12, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the headphone device is configured to detect the touch input comprise program instructions that are executable by the at least one processor such that the headphone device is configured to: determine, by the first processor, a type of the touch input based on one or more signals representing the touch input; and send, by the first processor to the second processor via the communication bus, data indicating the determined type of the touch input.

(Feature 20) The headphone device of feature 19, wherein the program instructions that are executable by the at least one processor such that the headphone device is configured to detect the touch input comprise program instructions that are executable by the at least one processor such that the headphone device is configured to: determine, by the first processor, one or more of a location or a movement of the touch input; and determine, by the first processor, the type of the touch input based on the determined location or movement of the touch input.

(Feature 21) The headphone device of feature 20, wherein the program instructions that are executable by the at least one processor such that the headphone device is configured to modify playback of the audio content based on the touch input comprise program instructions that are executable by the at least one processor such that the headphone device is configured to: modify playback of the audio content based on the determined type of the touch input.

(Feature 22) The headphone device of feature 20, wherein the at least one non-transitory computer readable medium comprises a first memory storing a first portion of the program instructions and a second memory storing a second portion of the program instructions.

(Feature 23) A wearable device comprising: a housing portion configured to be worn by a subject, the housing portion comprising a non-flat surface; a flexible touch-sensitive electronic assembly comprising: a flexible substrate having a first portion and a second portion, wherein the second portion extends from the first portion, and wherein the first portion is at least partially disposed on the non-flat surface of the housing portion; an array of capacitive touch sensor electrodes arranged on the first portion of the flexible substrate; and a plurality of conductors that are electrically coupled to the array of capacitive touch sensor electrodes and that extend onto the second portion of the flexible substrate, wherein the first portion of the flexible substrate includes a plurality of cutouts, and each cutout of a subset of the plurality of cutouts is positioned between a respective set of two or more electrodes in the array of capacitive touch sensor electrodes; one or more audio drivers; at least one processor; at least one communication interface; at least one non-transitory computer-readable medium; and program instructions stored on the at least one non-transitory computer-readable medium that are executable by the at least one processor such that the wearable device is configured to: receive, via the at least one communication interface, media content; cause the one or more audio drivers to play back the media content; detect, using the flexible touch-sensitive electronic assembly, a touch input; and after detection of the touch input, modify playback of the media content based on the touch input.

(Feature 24) The wearable device of feature 23, wherein the wearable device is a pair of smart-glasses and the non-flat surface is a temple portion of the smart-glasses.

(Feature 25) The wearable device of feature 23, wherein the wearable device is a smart watch and the non-flat surface is a body of the smart watch or a band of the smart watch.

(Feature 26) The wearable device of feature 23, wherein the plurality of cutouts include one or more linear cutouts, one or more cross-shaped cutouts, one or more triangular cutouts, or one or more circular cutouts.

(Feature 27) The wearable device of feature 23, wherein the plurality of cutouts include one or more linear cutouts, and wherein at least one linear cutout of the one or more linear cutouts includes a circular cutout at one or both ends of the linear cutout.

(Feature 28) The wearable device of feature 23, wherein the plurality of cutouts include one or more cross-shaped cutouts, and wherein at least one linear cross-shaped cutout of the one or more cross-shaped cutouts includes a circular cutout at one or more ends of the cross-shaped cutout.

(Feature 29) The wearable device of feature 23, wherein the plurality of cutouts include one or more triangular cutouts, and wherein at least one linear triangular cutout of the one or more triangular cutouts includes a circular cutout at a vertex of the triangular cutout.

(Feature 30) The wearable device of feature 23, wherein the plurality of cutouts include one or more cross-shaped cutouts, wherein the array of capacitive touch sensor electrodes includes a plurality of electrode columns and a plurality of electrode rows, and wherein the one or more cross-shaped cutouts are positioned at one or more intersections of the electrode columns and electrode rows.

(Feature 31) The wearable device of feature 23, wherein the plurality of cutouts include one or more triangular cutouts, and wherein at least one linear triangular cutout of the one or more triangular cutouts extends inward from an outer edge of the flexible substrate.

(Feature 32) The wearable device of feature 23, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the wearable device is configured to detect the touch input comprise program instructions that are executable by the at least one processor such that the wearable device is configured to: determine, by the first processor, a type of the touch input based on one or more signals representing the touch input; and send, by the first processor to the second processor via the communication bus, data indicating the determined type of the touch input.

(Feature 33) The wearable device of feature 32, wherein the program instructions that are executable by the at least one processor such that the wearable device is configured to detect the touch input comprise program instructions that are executable by the at least one processor such that the wearable device is configured to: determine, by the first processor, one or more of a location or a movement of the touch input; and determine, by the first processor, the type of the touch input based on the determined location or movement of the touch input.

(Feature 34) The wearable device of feature 33, wherein the program instructions that are executable by the at least one processor such that the wearable device is configured to modify playback of the media content based on the touch input comprise program instructions that are executable by the at least one processor such that the wearable device is configured to: modify playback of the media content based on the determined type of the touch input.

(Feature 35) The wearable device of feature 33, wherein the at least one non-transitory computer readable medium comprises a first memory storing a first portion of the program instructions and a second memory storing a second portion of the program instructions.

(Feature 36) A flexible electronic assembly comprising: a flexible substrate having a first portion and a second portion, wherein the second portion extends from the first portion; an array of capacitive touch sensor electrodes arranged on the first portion of the flexible substrate; and a plurality of conductors that are electrically coupled to the array of capacitive touch sensor electrodes and that extend onto the second portion of the flexible substrate, wherein the first portion of the flexible substrate includes a plurality of cutouts, wherein each cutout of a first subset of the plurality of cutouts is positioned between a respective set of two or more electrodes in the array of capacitive touch sensor electrodes, and wherein each cutout of a second subset of the plurality of cutouts is configured to reduce a wrinkling of the first portion of the flexible substrate when conforming the first portion of the flexible substrate to a non-flat surface.

(Feature 37) The flexible electronic assembly of feature 36, wherein the first subset of the plurality of cutouts at least partially overlaps with the second subset of the plurality of cutouts.

(Feature 38) The flexible electronic assembly of feature 37, wherein the first subset of the plurality of cutouts entirely overlaps with the second subset of the plurality of cutouts.

(Feature 39) The flexible electronic assembly of feature 36, wherein the plurality of cutouts include one or more linear cutouts, one or more cross-shaped cutouts, one or more triangular cutouts, or one or more circular cutouts.

(Feature 40) The flexible electronic assembly of feature 39, wherein the first subset of the plurality of cutouts includes the one or more linear cutouts, the one or more cross-shaped cutouts, or the one or more triangular cutouts.

(Feature 41) The flexible electronic assembly of feature 39, wherein the second subset of the plurality of cutouts includes the one or more linear cutouts, the one or more cross-shaped cutouts, the one or more triangular cutouts, or the one or more circular cutouts.

(Feature 42) The flexible electronic assembly of feature 36, wherein the plurality of cutouts include one or more linear cutouts, and wherein at least one linear cutout of the one or more linear cutouts includes a circular cutout at one or both ends of the linear cutout.

(Feature 43) The flexible electronic assembly of feature 36, wherein the plurality of cutouts include one or more cross-shaped cutouts, and wherein at least one cross-shaped cutout of the one or more cross-shaped cutouts includes a circular cutout at one or more ends of the cross-shaped cutout.

(Feature 44) The flexible electronic assembly of feature 36, wherein the plurality of cutouts include one or more triangular cutouts, and wherein at least one triangular cutout of the one or more triangular cutouts includes a circular cutout at a vertex of the triangular cutout.

(Feature 45) The flexible electronic assembly of feature 36, wherein the plurality of cutouts include one or more cross-shaped cutouts, wherein the array of capacitive touch sensor electrodes includes a plurality of electrode columns and a plurality of electrode rows, and wherein the one or more cross-shaped cutouts are positioned at one or more intersections of the electrode columns and electrode rows.

(Feature 46) The flexible electronic assembly of feature 36, wherein the plurality of cutouts include one or more triangular cutouts, and wherein at least one triangular cutout of the one or more triangular cutouts extends inward from an outer edge of the flexible substrate.

(Feature 47) The flexible electronic assembly of feature 36, wherein the flexible substrate is flat.

(Feature 48) The flexible electronic assembly of feature 36, wherein the second portion of the flexible substrate extends laterally from the first portion of the flexible substrate.

(Feature 49) The flexible electronic assembly of feature 36, further comprising at least one first contact disposed on the second portion of the substrate and electrically coupled to at least one of the plurality of conductors.

(Feature 50) The flexible electronic assembly of feature 49, wherein the at least one first contact is configured to engage at least one second contact of a flexible printed circuit (FPC) connector when an end of the second portion of the flexible substrate is inserted into the FPC connector.

(Feature 51) A method comprising: inserting a flexible electronic assembly into a jig to arrange the flexible electronic assembly in a predetermined orientation, wherein the flexible electronic assembly includes a flexible substrate and an array of capacitive touch sensor electrodes arranged on the flexible substrate; determining, using an optical sensor, a position and an angle of rotation of a housing portion of a playback device, the housing portion comprising a non-flat surface; and based on (i) the predetermined orientation of the flexible electronic assembly and (ii) the determined position and angle of rotation of the housing portion, aligning the housing portion with the flexible electronic assembly and causing the flexible electronic assembly to conform to the non-flat surface of the housing portion, wherein the flexible substrate of the flexible electronic assembly includes a plurality of cutouts, each respective cutout of the plurality of cutouts being positioned between respective electrodes in the array of capacitive touch sensor electrodes, and wherein the presence of the plurality of cutouts reduces a wrinkling of the flexible substrate when conforming the flexible substrate to the non-flat surface of the housing portion.

(Feature 52) The method of feature 51, wherein determining the position of the housing portion of the playback device comprises: using the optical sensor to determine a center point of the housing portion of the playback device; and determining the position of the housing portion of the playback device based on the determined center point.

(Feature 53) The method of feature 51, wherein the housing portion of the playback device includes text, and wherein determining the angle of rotation of the housing portion of the playback device comprises determining, using the optical sensor, an orientation of the text; and determining the angle of rotation of the housing portion of the playback device based on the determined orientation of the text.

(Feature 54) The method of feature 51, wherein the plurality of cutouts include one or more linear cutouts, one or more cross-shaped cutouts, one or more triangular cutouts, or one or more circular cutouts.

(Feature 55) The method of feature 54, wherein each linear cutout of the one or more linear cutouts includes a respective circular cutout at one or both ends of the linear cutout, wherein each cross-shaped cutout of the one or more cross-shaped cutouts includes a respective circular cutout at one or more ends of the cross-shaped cutout, and wherein each triangular cutout of the one or more triangular cutouts includes a respective circular cutout at a vertex of the triangular cutout.

(Feature 56) The method of feature 51, wherein the plurality of cutouts include one or more cross-shaped cutouts, wherein the array of capacitive touch sensor electrodes includes a plurality of electrode columns and a plurality of electrode rows, and wherein the one or more cross-shaped cutouts are positioned at one or more intersections of the electrode columns and electrode rows.

(Feature 57) A circuit board assembly comprising: a rigid substrate; a connector attached to the rigid substrate, the connector comprising a first plurality of contacts; a flexible substrate having a first portion and a second portion, wherein the second portion extends from the first portion; an array of capacitive touch sensor electrodes arranged on the first portion of the flexible substrate; a plurality of conductors that are electrically coupled to the array of capacitive touch sensor electrodes and that extend onto the second portion of the flexible substrate; and a second plurality of contacts that are electrically coupled to the plurality of conductors and arranged on the second portion of the flexible substrate, wherein an end of the second portion of the flexible substrate is configured to be inserted into the connector, wherein the second plurality of contacts are configured to engage the first plurality of contacts when the end of the second portion of the flexible substrate is inserted into the connector, wherein the first portion of the flexible substrate includes a plurality of cutouts, wherein each cutout of a first subset of the plurality of cutouts is positioned between a respective set of two or more electrodes in the array of capacitive touch sensor electrodes, and wherein each cutout of a second subset of the plurality of cutouts is configured to reduce a wrinkling of the first portion of the flexible substrate when conforming the first portion of the flexible substrate to a non-flat surface.

The invention claimed is:

1. A playback device comprising:
   a housing portion comprising a non-flat surface;
   a flexible touch-sensitive electronic assembly comprising:
      a flexible substrate having a first portion and a second portion, wherein the second portion extends from the first portion, and wherein the first portion is at least partially disposed on the non-flat surface of the housing portion;
      an array of capacitive touch sensor electrodes arranged on the first portion of the flexible substrate; and
      a plurality of conductors that are electrically coupled to the array of capacitive touch sensor electrodes and that extend onto the second portion of the flexible substrate,
      wherein the first portion of the flexible substrate includes a plurality of cutouts,
      wherein the plurality of cutouts includes one or more cross-shaped cutouts,
      wherein at least one cross-shaped cutout of the one or more cross-shaped cutouts includes a circular cutout at one or more ends of the at least one cross-shaped cutout, and
      wherein each cutout of a subset of the plurality of cutouts is positioned between a respective set of two or more electrodes in the array of capacitive touch sensor electrodes;
   one or more audio drivers;
   at least one processor;
   at least one communication interface;
   at least one non-transitory computer-readable medium; and
   program instructions stored on the at least one non-transitory computer-readable medium that are executable by the at least one processor such that the playback device is configured to:
      receive, via the at least one communication interface, media content;
      cause the one or more audio drivers to play back the media content;
      detect, using the flexible touch-sensitive electronic assembly, a touch input; and
      after detection of the touch input, modify playback of the media content based on the touch input.

2. The playback device of claim 1, wherein the plurality of cutouts include one or more linear cutouts, one or more triangular cutouts, or one or more circular cutouts.

3. The playback device of claim 1, wherein the plurality of cutouts include one or more linear cutouts, and wherein at least one linear cutout of the one or more linear cutouts includes a circular cutout at one or both ends of the at least one linear cutout.

4. The playback device of claim 1, wherein the plurality of cutouts include one or more triangular cutouts, and wherein at least one triangular cutout of the one or more triangular cutouts includes a circular cutout at a vertex of the at least one triangular cutout.

5. The playback device of claim 1, wherein the array of capacitive touch sensor electrodes includes a plurality of electrode columns and a plurality of electrode rows, and wherein the one or more cross-shaped cutouts are positioned at one or more intersections of the electrode columns and electrode rows.

6. The playback device of claim 1, wherein the plurality of cutouts include one or more triangular cutouts, and wherein at least one triangular cutout of the one or more triangular cutouts extends inward from an outer edge of the flexible substrate.

7. The playback device of claim 1, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the playback device is configured to detect the touch input comprise program instructions that are executable by the at least one processor such that the playback device is configured to:
   determine, by the first processor, a type of the touch input based on one or more signals representing the touch input; and
   send, by the first processor to the second processor via the communication bus, data indicating the determined type of the touch input.

8. The playback device of claim 7, wherein the program instructions that are executable by the at least one processor such that the playback device is configured to detect the touch input comprise program instructions that are executable by the at least one processor such that the playback device is configured to:
   determine, by the first processor, one or more of a location or a movement of the touch input; and determine, by the first processor, the type of the touch input based on the determined location or movement of the touch input.

9. The playback device of claim 8, wherein the program instructions that are executable by the at least one processor such that the playback device is configured to modify playback of the media content based on the touch input comprise program instructions that are executable by the at least one processor such that the playback device is configured to:
modify playback of the media content based on the determined type of the touch input.

10. The playback device of claim 8, wherein the at least one non-transitory computer readable medium comprises a first memory storing a first portion of the program instructions and a second memory storing a second portion of the program instructions.

11. A headphone device comprising:
a housing portion comprising a non-flat surface, wherein the housing portion is an earpiece of the headphone device and the earpiece is attached to a headband of the headphone device;
a flexible touch-sensitive electronic assembly comprising:
a flexible substrate having a first portion and a second portion, wherein the second portion extends from the first portion, and wherein the first portion is at least partially disposed on the non-flat surface of the housing portion;
an array of capacitive touch sensor electrodes arranged on the first portion of the flexible substrate; and
a plurality of conductors that are electrically coupled to the array of capacitive touch sensor electrodes and that extend onto the second portion of the flexible substrate,
wherein the first portion of the flexible substrate includes a plurality of cutouts,
wherein the plurality of cutouts includes one or more cross-shaped cutouts,
wherein at least one cross-shaped cutout of the one or more cross-shaped cutouts includes a circular cutout at one or more ends of the at least one cross-shaped cutout, and
wherein each cutout of a subset of the plurality of cutouts is positioned between a respective set of two or more electrodes in the array of capacitive touch sensor electrodes;
one or more audio drivers;
at least one processor;
at least one communication interface;
at least one non-transitory computer-readable medium; and
program instructions stored on the at least one non-transitory computer-readable medium that are executable by the at least one processor such that the headphone device is configured to:
receive, via the at least one communication interface, audio content;
cause the one or more audio drivers to play back the audio content;
detect, using the flexible touch-sensitive electronic assembly, a touch input; and
after detection of the touch input, modify playback of the audio content based on the touch input.

12. The headphone device of claim 11, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the headphone device is configured to detect the touch input comprise program instructions that are executable by the at least one processor such that the headphone device is configured to:
determine, by the first processor, a type of the touch input based on one or more signals representing the touch input; and
send, by the first processor to the second processor via the communication bus, data indicating the determined type of the touch input.

13. The headphone device of claim 12, wherein the program instructions that are executable by the at least one processor such that the headphone device is configured to detect the touch input comprise program instructions that are executable by the at least one processor such that the headphone device is configured to:
determine, by the first processor, one or more of a location or a movement of the touch input; and
determine, by the first processor, the type of the touch input based on the determined location or movement of the touch input.

14. The headphone device of claim 13, wherein the program instructions that are executable by the at least one processor such that the headphone device is configured to modify playback of the audio content based on the touch input comprise program instructions that are executable by the at least one processor such that the headphone device is configured to:
modify playback of the audio content based on the determined type of the touch input.

15. The headphone device of claim 13, wherein the at least one non-transitory computer readable medium comprises a first memory storing a first portion of the program instructions and a second memory storing a second portion of the program instructions.

16. A wearable device comprising:
a housing portion configured to be worn by a subject, the housing portion comprising a non-flat surface;
a flexible touch-sensitive electronic assembly comprising:
a flexible substrate having a first portion and a second portion, wherein the second portion extends from the first portion, and wherein the first portion is at least partially disposed on the non-flat surface of the housing portion;
an array of capacitive touch sensor electrodes arranged on the first portion of the flexible substrate; and
a plurality of conductors that are electrically coupled to the array of capacitive touch sensor electrodes and that extend onto the second portion of the flexible substrate,
wherein the first portion of the flexible substrate includes a plurality of cutouts,
wherein the plurality of cutouts includes one or more cross-shaped cutouts,
wherein at least one cross-shaped cutout of the one or more cross-shaped cutouts includes a circular cutout at one or more ends of the at least one cross-shaped cutout, and
wherein each cutout of a subset of the plurality of cutouts is positioned between a respective set of two or more electrodes in the array of capacitive touch sensor electrodes;
one or more audio drivers;

at least one processor;
at least one communication interface;
at least one non-transitory computer-readable medium; and
program instructions stored on the at least one non-transitory computer-readable medium that are executable by the at least one processor such that the wearable device is configured to:
  receive, via the at least one communication interface, media content;
  cause the one or more audio drivers to play back the media content;
  detect, using the flexible touch-sensitive electronic assembly, a touch input; and
  after detection of the touch input, modify playback of the media content based on the touch input.

17. The wearable device of claim 16, wherein the wearable device is a pair of smart-glasses and the non-flat surface is a temple portion of the smart-glasses.

18. The wearable device of claim 16, wherein the wearable device is a smart watch and the non-flat surface is a body of the smart watch or a band of the smart watch.

19. The wearable device of claim 16, wherein the at least one processor includes (i) a first processor electrically coupled to the array of capacitive touch sensor electrodes via the plurality of conductors and (ii) a second processor electrically coupled to the first processor via a communication bus, and wherein the program instructions that are executable by the at least one processor such that the wearable device is configured to detect the touch input comprise program instructions that are executable by the at least one processor such that the wearable device is configured to:
  determine, by the first processor, a type of the touch input based on one or more signals representing the touch input; and
  send, by the first processor to the second processor via the communication bus, data indicating the determined type of the touch input.

20. The wearable device of claim 16, wherein:
the array of capacitive touch sensor electrodes includes a plurality of electrode columns and a plurality of electrode rows; and
the one or more cross-shaped cutouts are positioned at one or more intersections of the electrode columns and electrode rows.

* * * * *

UNITED STATES PATENT AND TRADEMARK OFFICE
CERTIFICATE OF CORRECTION

PATENT NO. : 12,118,268 B2  
APPLICATION NO. : 17/731601  
DATED : October 15, 2024  
INVENTOR(S) : Mark S. Viscusi and Ronald W. Roberts, Jr.

Page 1 of 1

It is certified that error appears in the above-identified patent and that said Letters Patent is hereby corrected as shown below:

On the Title Page

Item (72) "Inventors" should read:  
Mark S. Viscusi, Wrentham, MA (US);  
Ronald W. Roberts, Jr., Melrose, MA (US).

Signed and Sealed this  
Twenty-fourth Day of June, 2025

Coke Morgan Stewart  
*Acting Director of the United States Patent and Trademark Office*